United States Patent
Rico Alvarino et al.

(10) Patent No.: US 11,424,855 B2
(45) Date of Patent: Aug. 23, 2022

(54) PHYSICAL BROADCAST CHANNEL (PBCH) AND MASTER INFORMATION BLOCK (MIB) DESIGN

(71) Applicant: QUALCOMM Incorporated, San Diego, CA (US)

(72) Inventors: Alberto Rico Alvarino, San Diego, CA (US); Xiaofeng Wang, San Diego, CA (US); Peter Gaal, San Diego, CA (US); Wanshi Chen, San Diego, CA (US); Juan Montojo, San Diego, CA (US); Hao Xu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 40 days.

(21) Appl. No.: 15/382,280

(22) Filed: Dec. 16, 2016

(65) Prior Publication Data
US 2017/0187488 A1 Jun. 29, 2017

Related U.S. Application Data

(60) Provisional application No. 62/272,063, filed on Dec. 28, 2015.

(51) Int. Cl.
*H04L 1/00* (2006.01)
*H04W 72/00* (2009.01)
(Continued)

(52) U.S. Cl.
CPC ........ *H04L 1/0041* (2013.01); *G06F 11/1004* (2013.01); *H03M 13/09* (2013.01);
(Continued)

(58) Field of Classification Search
CPC ....... H04L 1/0041; H04L 1/0046; H04L 1/08; H04L 1/0059; H04L 1/0058;
(Continued)

(56) References Cited

U.S. PATENT DOCUMENTS

| | | | |
|---|---|---|---|
| 8,416,891 B2 | 4/2013 | Mansson et al. | |
| 8,635,517 B2 | 1/2014 | Abu-Surra et al. | |

(Continued)

OTHER PUBLICATIONS

International Search Report and Written Opinion—PCT/US2016/067457—ISA/EPO—dated May 10, 2017.
(Continued)

*Primary Examiner* — Cynthia Britt
*Assistant Examiner* — Rong Tang
(74) *Attorney, Agent, or Firm* — Patterson + Sheridan, LLP

(57) ABSTRACT

Aspects of the present disclosure provide techniques for physical broadcast channel (PBCH) and master information block (MIB) design. An example method is provided for operations which may be performed by a user equipment (UE). The example method generally comprises receiving, a first number of symbols within a first subframe on a physical channel, performing a first blind decode on the first number of symbols to obtain a first set of bits, performing one or more cyclic shifts on the first set of bits, calculating a redundancy check value for the first set of bits, and decoding an information block based on the whether the redundancy check value passes. Aspects of the present disclosure provide techniques for transmission configurations. An example method is provided for operations which may be performed by a base station (BS). The example method generally comprises selecting a transmission configuration, from a set of predetermined transmission configurations, based on a deployment configuration, generating a signal having an indication of the deployment configuration, and transmitting the signal.

17 Claims, 16 Drawing Sheets

(51) Int. Cl.
*G06F 11/10* (2006.01)
*H03M 13/09* (2006.01)
*H03M 13/23* (2006.01)
*H04L 5/00* (2006.01)
*H04L 27/00* (2006.01)
*H04L 1/08* (2006.01)
*H04L 1/18* (2006.01)

(52) U.S. Cl.
CPC .......... *H03M 13/23* (2013.01); *H04L 1/0045* (2013.01); *H04L 1/0046* (2013.01); *H04L 1/0058* (2013.01); *H04L 1/0059* (2013.01); *H04L 1/0061* (2013.01); *H04L 1/08* (2013.01); *H04L 5/0007* (2013.01); *H04L 5/0051* (2013.01); *H04L 27/00* (2013.01); *H04W 72/005* (2013.01); *H04L 1/1812* (2013.01)

(58) Field of Classification Search
CPC ... H04L 1/0045; H04L 1/0061; H04L 5/0051; H04L 5/0007; H04L 27/00; H04W 72/005; H03M 13/23; H03M 13/09; G06F 11/1004
See application file for complete search history.

(56) References Cited

U.S. PATENT DOCUMENTS

| | | | | |
|---|---|---|---|---|
| 9,622,231 | B2* | 4/2017 | Hong | H04L 5/0053 |
| 2002/0144208 | A1* | 10/2002 | Gallezot | H03M 13/091 |
| | | | | 714/781 |
| 2011/0085513 | A1* | 4/2011 | Chen | H04L 5/0053 |
| | | | | 370/330 |
| 2011/0228883 | A1* | 9/2011 | Liu | H04L 1/0045 |
| | | | | 375/341 |
| 2011/0255631 | A1* | 10/2011 | Pi | H03M 13/23 |
| | | | | 375/295 |
| 2013/0039188 | A1* | 2/2013 | Larsson | H04L 1/0039 |
| | | | | 370/241 |
| 2013/0121274 | A1* | 5/2013 | Chen | H04L 5/0053 |
| | | | | 370/329 |
| 2014/0071957 | A1* | 3/2014 | Xu | H04W 52/0219 |
| | | | | 370/336 |
| 2015/0237602 | A1 | 8/2015 | Chae et al. | |
| 2015/0373668 | A1 | 12/2015 | Lee et al. | |

OTHER PUBLICATIONS

"3rd Generation Partnership Project, Technical Specification Group Radio Access Network, Evolved Universal Terrestrial Radio Access (E-UTRA), Physical channels and modulation (Release 12)", 3GPP Draft, Draft 36211-C70, 3rd Generation Partnership Project (3GPP), Mobile Competence Centre, 650, Route Des Lucioles, F-06921 Sophia-Antipolis Cedex, France, Sep. 22, 2015, XP051021009, Retrieved from the Internet: URL:http://www.3gpp.org/ftpjtsg ran/ WG1 RL1/DRAFT/.

Partial International Search Report and Written Opinion—PCT/ US2016/067457—ISA/EPO—dated Mar. 16, 2017.

Qualcomm Incorporated: "NB-PBCH design", 3GPP Draft, R1-160102, NB-PBCH Design, 3rd Generation Partnership Project (3gpp), Mobile Competence Centre, 650, Route Des Lucioles, F-06921 Sophia-Antipolis Cedex, France, vol. RAN WG1, No. Budapest, HU, Jan. 18, 2016-Jan. 20, 2016, Jan. 12, 2016 (Jan. 12, 2016), XP051064715, Retrieved from the Internet: URL:http://www.3gpp. orgjftp/tsg ran/WG1 RL1/TSGR1 AH/LTE NB-IoT 1601/Docs/.

Qualcomm Incorporated: "Physical Downlink Control Channels", 3GPP Draft; R1-155705, Physical Downlink Control Channels, 3rd Generation Partnership Project (3gpp), Mobile Competence Centre, 650, Route Des Lucioles, F-06921 Sophia-Antipolis Cedex, France, vol. RAN WG1, No. Malmo, Sweden, Oct. 5, 2015-Oct. 9, 2015, Sep. 26, 2015, XP051021709, Retrieved from the Internet: URL:http:// www.3gpp.orgjftp/tsg ranJWG1RL1/TSGR1 82b/Docs/.

Sesia S., et al., LTE—the UMTS Long Term Evolution: from Theory to Practice in: "LTE—the UMTS Long Term Evolution: from Theory to Practice, (Release 10)", Aug. 31, 2011, XP055349815, 794 pages.

* cited by examiner

| Deployment | Tx Power | Total power for PBCH | Difference wrt Standalone |
|---|---|---|---|
| Standalone | 43dBm | 43dBm | 0dB |
| 1.4Mhz | 43dBm | 35.21dBm | 8dB |
| 3Mhz | 43dBm | 31.23dBm | 12dB |
| 5Mhz | 43dBm | 29dBm | 14dB |
| 10Mhz | 46dBm | 29dBm | 14dB |
| 15Mhz | 46dBm | 27dBm | 16dB |
| 20Mhz | 46dBm | 26dBm | 17dB |

*FIG. 13*

PHYSICAL BROADCAST CHANNEL (PBCH) AND MASTER INFORMATION BLOCK (MIB) DESIGN

CLAIM OF PRIORITY UNDER 35 U.S.C. § 119

The present application for patent claims benefit of U.S. Provisional Patent Application Ser. No. 62/272,063, filed Dec. 28, 2015, which is assigned to the assignee hereof and hereby expressly incorporated by reference herein in their entirety.

BACKGROUND

Field of the Disclosure

Certain aspects of the present disclosure generally relate to wireless communications and, more particularly, to physical broadcast channel (PBCH) and master information block (MIB) design and transmission configuration based on deployment configuration.

Description of Related Art

Wireless communication systems are widely deployed to provide various types of communication content such as voice, data, and so on. These systems may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, 3rd Generation Partnership Project (3GPP) Long Term Evolution (LTE)/LTE-Advanced systems and orthogonal frequency division multiple access (OFDMA) systems.

Generally, a wireless multiple-access communication system can simultaneously support communication for multiple wireless terminals. Each terminal communicates with one or more base stations via transmissions on the forward and reverse links. The forward link (or downlink) refers to the communication link from the base stations to the terminals, and the reverse link (or uplink) refers to the communication link from the terminals to the base stations. This communication link may be established via a single-input single-output, multiple-input single-output or a multiple-input multiple-output (MIMO) system.

A wireless communication network may include a number of base stations that can support communication for a number of wireless devices. Wireless devices may include user equipments (UEs). Some examples of UEs may include cellular phones, smart phones, personal digital assistants (PDAs), wireless modems, handheld devices, tablets, laptop computers, netbooks, smartbooks, ultrabooks, etc. Some UEs may be considered machine-type communication (MTC) UEs, which may include remote devices, such as sensors, meters, monitors, location tags, etc., that may communicate with a base station, another remote device, or some other entity. Machine type communications (MTC) may refer to communication involving at least one remote device on at least one end of the communication and may include forms of data communication which involve one or more entities that do not necessarily need human interaction. MTC UEs may include UEs that are capable of MTC communications with MTC servers and/or other MTC devices through Public Land Mobile Networks (PLMN), for example.

SUMMARY

Certain aspects of the present disclosure provide a method for wireless communications by a user equipment (UE). The method generally includes receiving, a first number of symbols within a first subframe on a physical channel, performing a first blind decode on the first number of symbols to obtain a first set of bits, performing one or more cyclic shifts on the first set of bits, calculating a redundancy check value for the first set of bits, and decoding an information block based on the whether the redundancy check value passes.

Certain aspects of the present disclosure provide a method for wireless communications by a base station (BS). The method generally includes calculating a redundancy check value for a first set of bits, performing one or more cyclic shifts on the first set of bits, generating, a first number of symbols based on the first set of bits and the redundancy check value within a first subframe on a physical channel, and transmitting the first subframe on the physical channel.

Certain aspects of the present disclosure provide a method for wireless communications by a base station (BS). The method generally includes selecting a transmission configuration, from a set of predetermined transmission configurations, based on a deployment configuration, generating a signal having an indication of the deployment configuration, and transmitting the signal.

Certain aspects of the present disclosure provide a method for wireless communications by a user equipment (UE). The method generally includes receiving a signal having an indication of the deployment configuration, and selecting a transmission configuration from a set of predetermined transmission configurations, based on the indication of the deployment configuration.

Numerous other aspects are provided including methods, apparatus, systems, computer program products, and processing systems.

BRIEF DESCRIPTION OF THE DRAWINGS

FIG. 13 illustrates example power levels for various NB-IoT deployments, according to certain aspects of the present disclosure.

The Appendix includes details of various aspects of the present disclosure.

DETAILED DESCRIPTION

Certain aspects of the present disclosure generally relate to design of PBCH and MIB for narrowband internet of things (NB-IoT) operation. A MIB may be transmitted in a set of PBCH symbols in a dedicated PBCH channel. A device receiving the PBCH performs a set of blind decodes on the PBCH symbols to obtain the MIB. Certain devices may be relatively simple, low powered devices. Instead of performing multiple blind decodes, such devices may be configured to perform a reduced number of decode steps and apply a set of cyclic shifts with redundancy checks to obtain the MIB.

The techniques described herein may be used for various wireless communication networks such as CDMA, TDMA, FDMA, OFDMA, SC-FDMA and other networks. The terms "network" and "system" are often used interchangeably. A CDMA network may implement a radio technology such as universal terrestrial radio access (UTRA), cdma2000, etc. UTRA includes wideband CDMA (WCDMA), time division synchronous CDMA (TD-SCDMA), and other variants of CDMA. cdma2000 covers IS-2000, IS-95 and IS-856 standards. A TDMA network may implement a radio technology such as global system for mobile communications (GSM). An OFDMA network may implement a radio technology such as evolved UTRA (E-UTRA), ultra mobile broadband (UMB), IEEE 802.11 (Wi-Fi), IEEE 802.16 (WiMAX), IEEE 802.20, Flash-OFDM®, etc. UTRA and E-UTRA are part of universal mobile telecommunication system (UMTS). 3GPP Long Term Evolution (LTE) and LTE-Advanced (LTE-A), in both frequency division duplex (FDD) and time division duplex (TDD), are new releases of UMTS that use E-UTRA, which employs OFDMA on the downlink and SC-FDMA on the uplink. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies mentioned above as well as other wireless networks and radio technologies. For clarity, certain aspects of the techniques are described below for LTE/LTE-Advanced, and LTE/LTE-Advanced terminology is used in much of the description below. LTE and LTE-A are referred to generally as LTE.

Example Wireless Communication System

Figure 1:
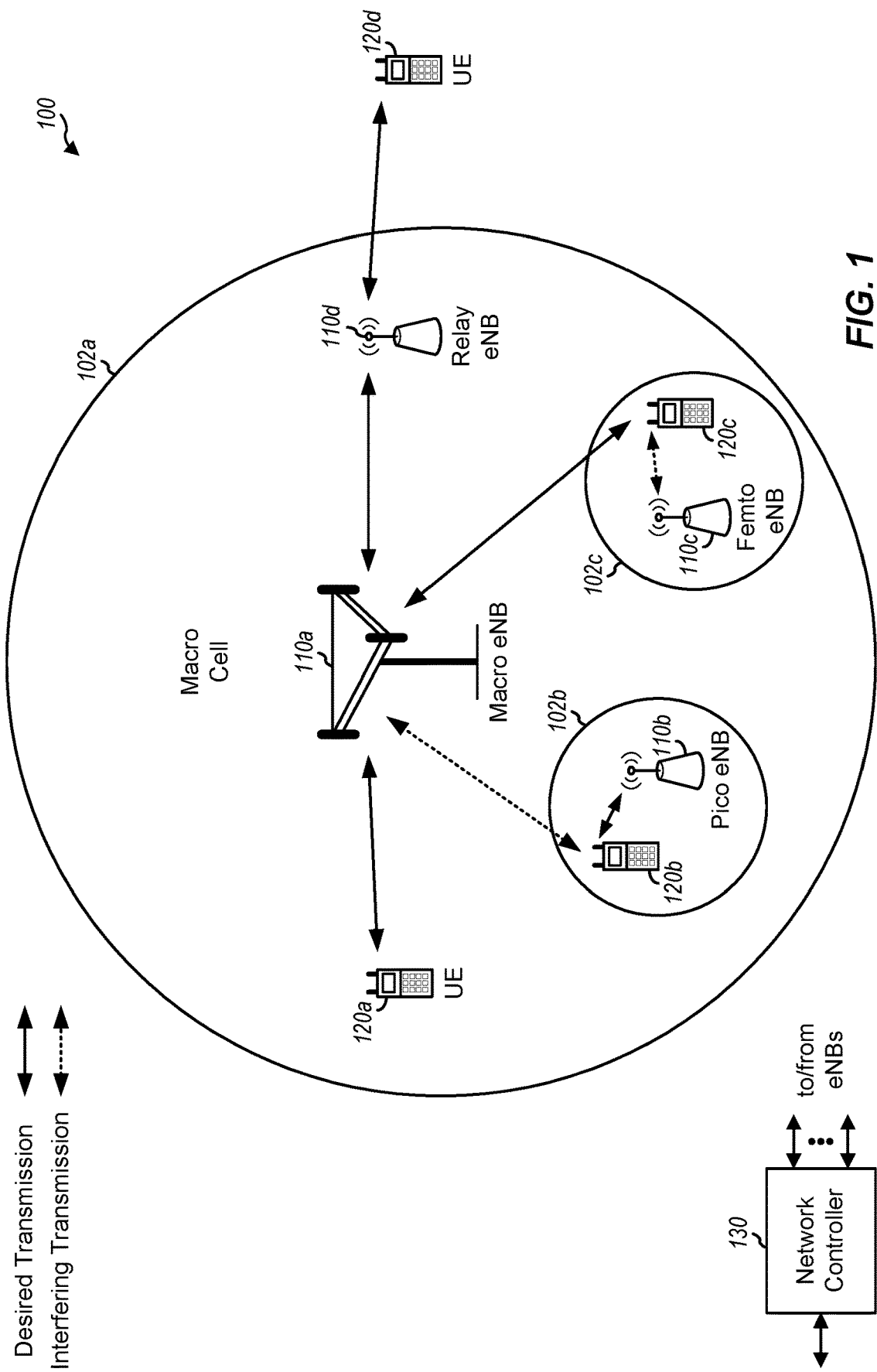
FIG. 1 is a block diagram conceptually illustrating an example of a wireless communication network, in accordance with certain aspects of the present disclosure.

FIG. 1 illustrates an example wireless communication network 100, in which aspects of the present disclosure may be practiced. For example, techniques presented herein may be used to help UEs and BSs shown in FIG. 1 communicate on a machine type physical downlink control channel (mPDCCH) using a narrowband (e.g., six-PRB) based search space.

The network 100 may be an LTE network or some other wireless network. Wireless network 100 may include a number of evolved Node Bs (eNBs) 110 and other network entities. An eNB is an entity that communicates with user equipments (UEs) and may also be referred to as a base station, a Node B, an access point, etc. Each eNB may provide communication coverage for a particular geographic area. In 3GPP, the term "cell" can refer to a coverage area of an eNB and/or an eNB subsystem serving this coverage area, depending on the context in which the term is used. Some examples of UEs may include cellular phones, smart phones, personal digital assistants (PDAs), wireless modems, handheld devices, tablets, laptop computers, netbooks, smartbooks, ultrabooks, wearable devices (e.g., smart glasses, smart bracelets, smart wrist bands, smart rings, smart watches, smart clothing), drones, robots, etc. Some UEs may be considered machine-type communication (MTC) UEs, which may include remote devices, such as sensors, meters, monitors, location tags, drones, robots, etc., that may communicate with a base station, another remote device, or some other entity. Machine type communications (MTC) may refer to communication involving at least one remote device on at least one end of the communication and may include forms of data communication which involve one or more entities that do not necessarily need human interaction.

An eNB may provide communication coverage for a macro cell, a pico cell, a femto cell, and/or other types of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). An eNB for a macro cell may be referred to as a macro eNB. An eNB for a pico cell may be referred to as a pico eNB. An eNB for a femto cell may be referred to as a femto eNB or a home eNB (HeNB). In the example shown in FIG. 1, an eNB 110a may be a macro eNB for a macro cell 102a, an eNB 110b may be a pico eNB for a pico cell 102b, and an eNB 110c may be a femto eNB for a femto cell 102c. An eNB may support one or multiple (e.g., three) cells. The terms "eNB", "base station" and "cell" may be used interchangeably herein.

Wireless network 100 may also include relay stations. A relay station is an entity that can receive a transmission of data from an upstream station (e.g., an eNB or a UE) and send a transmission of the data to a downstream station (e.g., a UE or an eNB). A relay station may also be a UE that can relay transmissions for other UEs. In the example shown in FIG. 1, a relay station 110d may communicate with macro eNB 110a and a UE 120d in order to facilitate communication between eNB 110a and UE 120d. A relay station may also be referred to as a relay eNB, a relay base station, a relay, etc.

Wireless network 100 may be a heterogeneous network that includes eNBs of different types, e.g., macro eNBs, pico eNBs, femto eNBs, relay eNBs, etc. These different types of eNBs may have different transmit power levels, different coverage areas, and different impact on interference in wireless network 100. For example, macro eNBs may have a high transmit power level (e.g., 5 to 40 Watts) whereas pico eNBs, femto eNBs, and relay eNBs may have lower transmit power levels (e.g., 0.1 to 2 Watts).

A network controller 130 may couple to a set of eNBs and may provide coordination and control for these eNBs. Network controller 130 may communicate with the eNBs via a backhaul. The eNBs may also communicate with one another, e.g., directly or indirectly via a wireless or wireline backhaul.

UEs 120 (e.g., 120a, 120b, 120c) may be dispersed throughout wireless network 100, and each UE may be stationary or mobile. A UE may also be referred to as an access terminal, a terminal, a mobile station, a subscriber unit, a station, etc. A UE may be a cellular phone, a personal digital assistant (PDA), a wireless modem, a wireless communication device, a handheld device, a laptop computer, a cordless phone, a wireless local loop (WLL) station, a tablet, a smart phone, a netbook, a smartbook, an ultrabook, etc. In FIG. 1, a solid line with double arrows indicates desired transmissions between a UE and a serving eNB, which is an eNB designated to serve the UE on the downlink and/or uplink. A dashed line with double arrows indicates potentially interfering transmissions between a UE and an eNB.

One or more UEs 120 in the wireless communication network 100 (e.g., an LTE network) may also be a narrowband bandwidth UE. These UEs may co-exist with legacy and/or advanced UEs (e.g., capable of operating on a wider bandwidth) in the LTE network and may have one or more capabilities that are limited when compared to the other UEs in the wireless network. For example, in LTE Rel-12, when compared to legacy and/or advanced UEs in the LTE network, the narrowband UEs may operate with one or more of the following: a reduction in maximum bandwidth (relative to legacy UEs), a single receive radio frequency (RF) chain, reduction of peak rate (e.g., a maximum of 1000 bits for a transport block size (TBS) may be supported), reduction of transmit power, rank 1 transmission, half duplex operation, etc. In some cases, if half duplex operation is supported, the narrowband UEs may have a relaxed switching timing from transmit to receive (or from receive to transmit) operations. For example, in one case, compared to a switching timing of 20 microseconds (us) for legacy and/or advanced UEs, the narrowband UEs may have a relaxed switching timing of 1 millisecond (ms).

In some cases, the narrowband UEs (e.g., in LTE Rel-12) may also be able to monitor downlink (DL) control channels in the same away as legacy and/or advanced UEs in the LTE network monitor DL control channels. Release 12 narrowband UEs may still monitor downlink (DL) control channels in the same way as regular UEs, for example, monitoring for wideband control channels in the first few symbols (e.g., physical downlink control channel (PDCCH)) as well as narrowband control channels occupying a relatively narrowband, but spanning a length of a subframe (e.g., enhanced PDCCH (ePDCCH)).

According to certain aspects, narrowband UEs may be limited to a particular narrowband assignment of 1.4 MHz or six resource blocks (RBs) partitioned out of the available system bandwidth) while co-existing within a wider system bandwidth (e.g., at 1.4/3/5/10/15/20 MHz). Additionally, narrowband UEs may also be able to support one or more coverage modes of operation. For example, the narrowband UE may be able to support coverage enhancements up to 15 dB.

As used herein, devices with limited communication resources, e.g. smaller bandwidth, may be referred to generally as narrowband UEs. Similarly, legacy devices, such as legacy and/or advanced UEs (e.g., in LTE) may be referred to generally as wideband UEs. Generally, wideband UEs are capable of operating on a larger amount of bandwidth than narrowband UEs.

In some cases, a UE (e.g., a narrowband UE or a wideband UE) may perform a cell search and acquisition procedure before communicating in the network. In one case, with reference to the LTE network illustrated in FIG. 1 as an example, the cell search and acquisition procedure may be performed when the UE is not connected to a LTE cell and wants to access the LTE network. In these cases, the UE may have just powered on, restored a connection after temporarily losing connection to the LTE cell, etc.

In other cases, the cell search and acquisition procedure may be performed when the UE is already connected to a LTE cell. For example, the UE may have detected a new LTE cell and may prepare a handover to the new cell. As another example, the UE may be operating in one or more low power states (e.g., may support discontinuous reception (DRX)) and, upon exiting the one or more low power states, may have to perform the cell search and acquisition procedure (even though the UE is still in connected mode).

Figure 2:
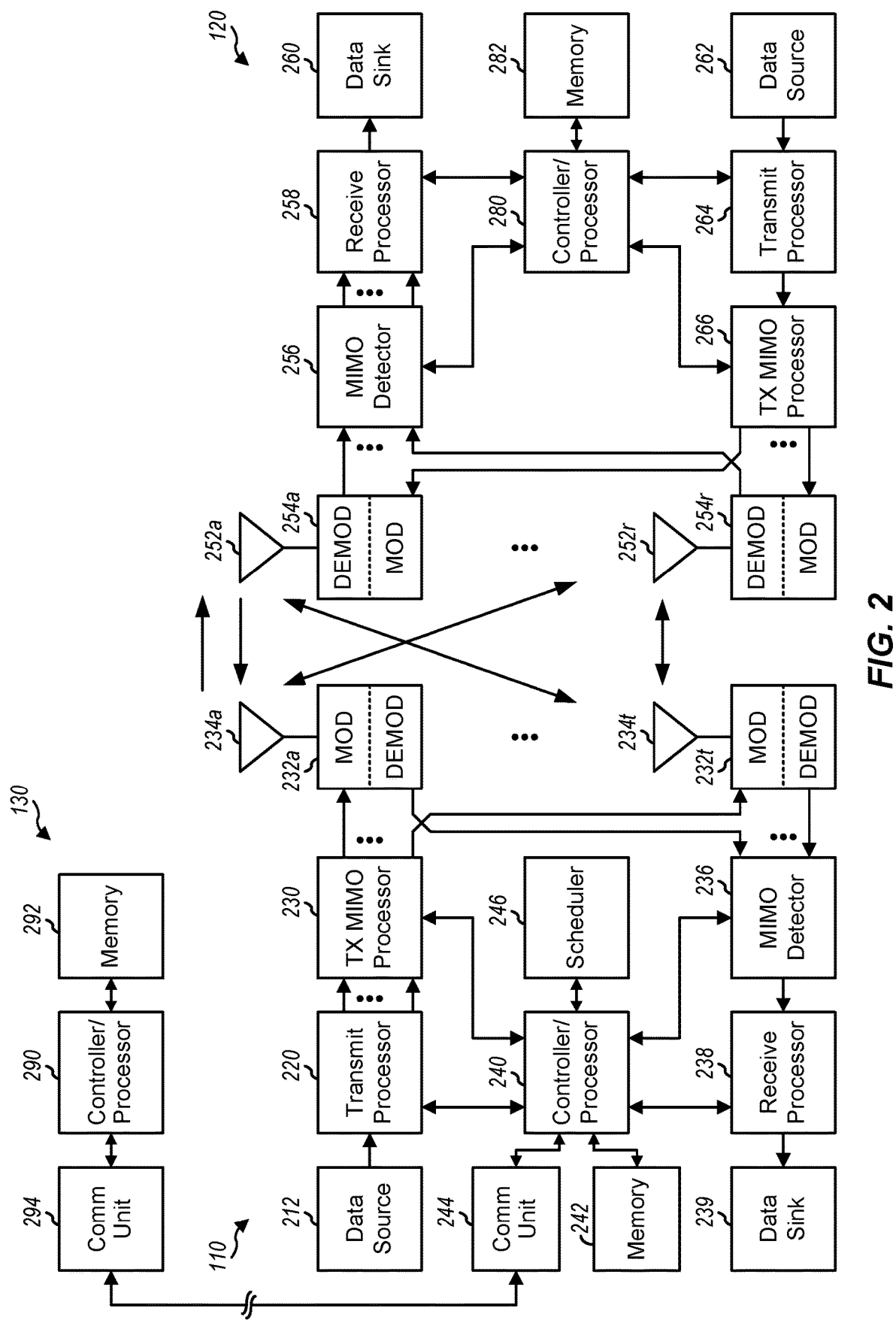
FIG. 2 shows a block diagram conceptually illustrating an example of a base station in communication with a user equipment (UE) in a wireless communications network, in accordance with certain aspects of the present disclosure.

FIG. 2 shows a block diagram of a design of base station/eNB 110 and UE 120, which may be one of the base stations/eNBs and one of the UEs in FIG. 1. Base station 110 may be equipped with T antennas 234a through 234t, and UE 120 may be equipped with R antennas 252a through 252r, where in general T≥1 and R≥1.

At base station 110, a transmit processor 220 may receive data from a data source 212 for one or more UEs, select one or more modulation and coding schemes (MCS) for each UE based on CQIs received from the UE, process (e.g., encode and modulate) the data for each UE based on the MCS(s) selected for the UE, and provide data symbols for all UEs. Transmit processor 220 may also process system information (e.g., for SRPI, etc.) and control information (e.g., CQI requests, grants, upper layer signaling, etc.) and provide overhead symbols and control symbols. Processor 220 may also generate reference symbols for reference signals (e.g., the CRS) and synchronization signals (e.g., the PSS and SSS). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM, etc.) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively.

At UE 120, antennas 252a through 252r may receive the downlink signals from base station 110 and/or other base stations and may provide received signals to demodulators (DEMODs) 254a through 254r, respectively. Each demodulator 254 may condition (e.g., filter, amplify, downconvert, and digitize) its received signal to obtain input samples. Each demodulator 254 may further process the input samples (e.g., for OFDM, etc.) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. A channel processor may determine RSRP, RSSI, RSRQ, CQI, etc.

On the uplink, at UE 120, a transmit processor 264 may receive and process data from a data source 262 and control information (e.g., for reports comprising RSRP, RSSI, RSRQ, CQI, etc.) from controller/processor 280. Processor 264 may also generate reference symbols for one or more reference signals. The symbols from transmit processor 264 may be precoded by a TX MIMO processor 266 if applicable, further processed by modulators 254a through 254r (e.g., for SC-FDM, OFDM, etc.), and transmitted to base station 110. At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Processor 238 may provide the decoded data to a data sink 239 and the decoded control information to controller/processor 240. Base station 110 may include communication unit 244 and communicate to network controller 130 via communication unit 244. Network controller 130 may include communication unit 294, controller/processor 290, and memory 292.

Controllers/processors 240 and 280 may direct the operation at base station 110 and UE 120, respectively. For example, processor 280 and/or other processors and modules at UE 120 may perform or direct operations 800 and 1600 shown in FIGS. 8 and 16, and processor 240 and/or other processors and modules at base station 110 may perform or direct operations 900 and 1500 shown in FIGS. 9 and 15. Memories 242 and 282 may store data and program codes for base station 110 and UE 120, respectively. A scheduler 246 may schedule UEs for data transmission on the downlink and/or uplink.

Figure 3:
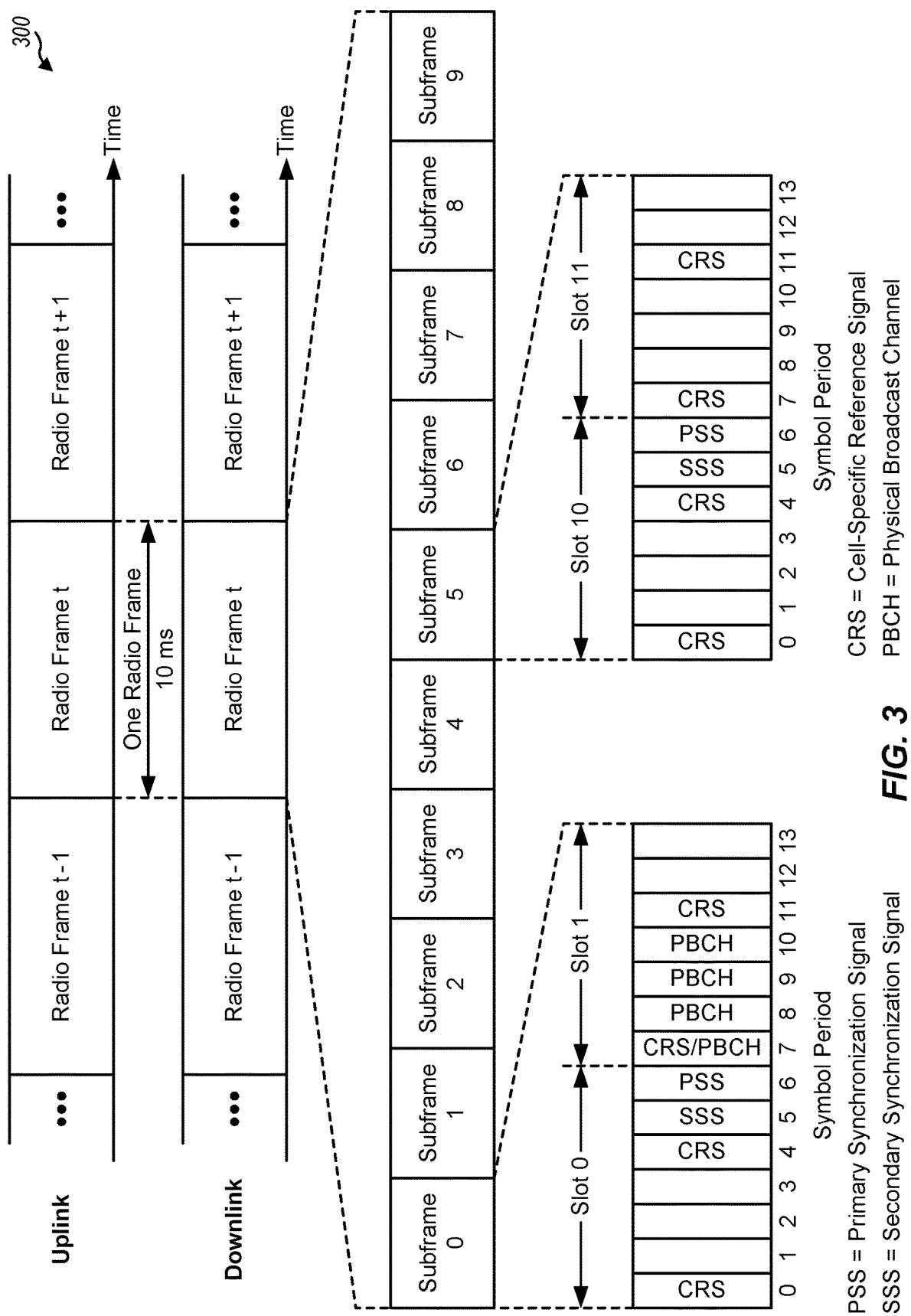
FIG. 3 shows an exemplary frame structure for frequency division duplexing (FDD) in long term evolution (LTE).

FIG. 3 shows an exemplary frame structure 300 for FDD in LTE. The transmission timeline for each of the downlink and uplink may be partitioned into units of radio frames. Each radio frame may have a predetermined duration (e.g., 10 milliseconds (ms)) and may be partitioned into 10 subframes with indices of 0 through 9. Each subframe may include two slots. Each radio frame may thus include 20 slots with indices of 0 through 19. Each slot may include L symbol periods, e.g., seven symbol periods for a normal cyclic prefix (as shown in FIG. 3) or six symbol periods for an extended cyclic prefix. The 2L symbol periods in each subframe may be assigned indices of 0 through 2L−1.

In LTE, an eNB may transmit a primary synchronization signal (PSS) and a secondary synchronization signal (SSS) on the downlink in the center of the system bandwidth for each cell supported by the eNB. The PSS and SSS may be transmitted in symbol periods 6 and 5, respectively, in subframes 0 and 5 of each radio frame with the normal cyclic prefix, as shown in FIG. 3. The PSS and SSS may be used by UEs for cell search and acquisition and may contain, among other information, the cell ID along with an indication of the duplexing mode. The indication of the duplexing mode may indicate whether the cell utilizes a time division duplexing (TDD) or frequency division duplexing (FDD) frame structure. The eNB may transmit a cell-specific reference signal (CRS) across the system bandwidth for each cell supported by the eNB. The CRS may be transmitted in certain symbol periods of each subframe and may be used by the UEs to perform channel estimation, channel quality measurement, and/or other functions. The eNB may also transmit a physical broadcast channel (PBCH) in symbol periods 0 to 3 in slot 1 of certain radio frames. The PBCH may carry some system information. The eNB may transmit other system information such as system information blocks (SIBs) on a physical downlink shared channel (PDSCH) in certain subframes. The eNB may transmit control information/data on a physical downlink control channel (PDCCH) in the first B symbol periods of a subframe, where B may be configurable for each subframe. The eNB may transmit traffic data and/or other data on the PDSCH in the remaining symbol periods of each subframe.

Channel quality measurements may be performed by a UE according to a defined schedule, such one based on the DRX cycle of the UE. For example, a UE may attempt to perform measurements for a serving cell at every DRX cycle. The UE may also attempt to perform measurements for non-serving neighboring cells. Measurements for non-serving neighbor cells may be made based on a different schedule than for serving cells and the UE may need to tune away from the serving cell to measure non-serving cells when the UE is in connected mode.

To facilitate channel quality measurements, an eNB may transmit a cell specific reference signal (CRS) on specific subframes. For example, an eNB may transmit CRS over subframes 0 and 5 for a given frame. A narrowband UE may receive this signal and measure the average power of the received signal, or RSRP. The narrowband UE may also calculate a Receive Signal Strength Indicator (RSSI) based on the total received signal power from all sources. A RSRQ may be also be calculated based on the RSRP and RSSI.

To facilitate measurements, an eNB may provide a measurement configuration to UEs in its coverage area. The measurement configuration may define event triggers for measurement reporting and each event trigger may have associated parameters. When the UE detects a configured measurement event, it may respond by sending a measurement report to the eNB with information about the associated measurement objects. A configured measurement event may be, for example, a measured reference signal received power (RSRP) or a measured reference signal received quality (RSRQ) satisfying a threshold. A time-to-trigger (TTT) parameter can be used to define how long a measurement event must persist before the UE sends its measurement report. In this way, the UE can signal changes in its radio conditions to the network.

Figure 4:
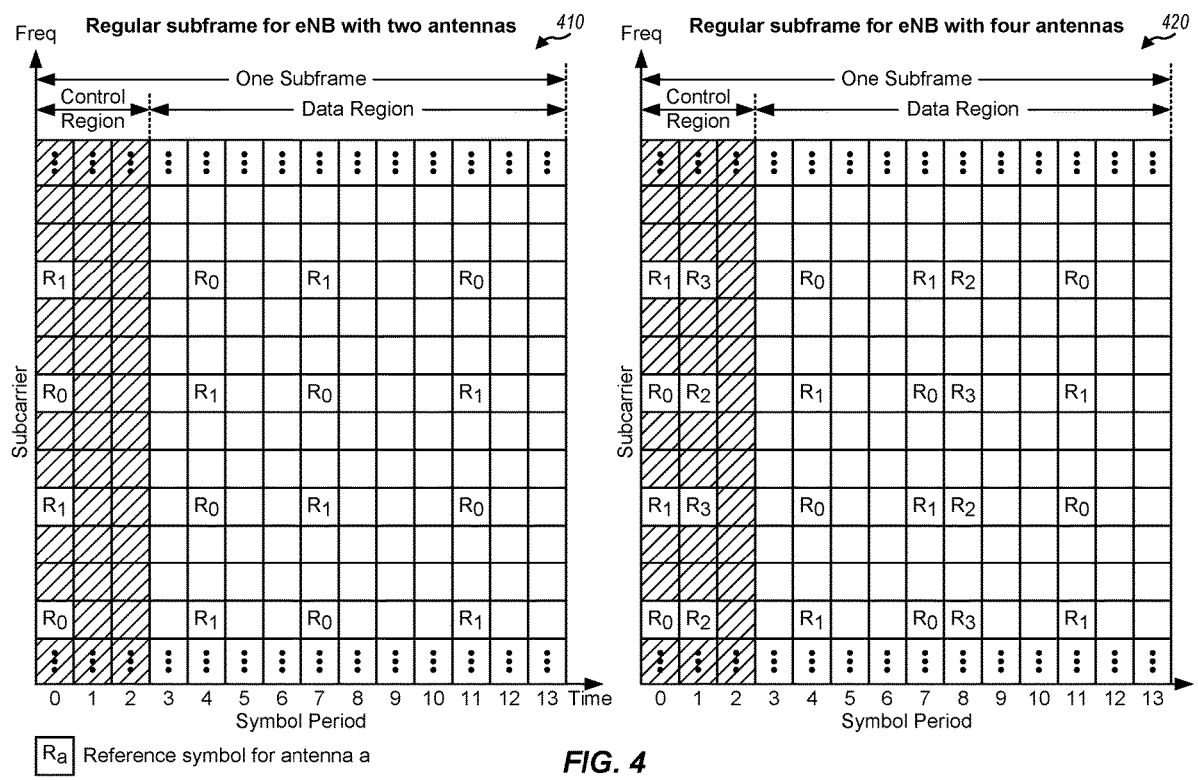
FIG. 4 shows two exemplary subframe formats with the normal cyclic prefix.

FIG. 4 shows two exemplary subframe formats 410 and 420 with the normal cyclic prefix. The available time frequency resources may be partitioned into resource blocks. Each resource block may cover 12 subcarriers in one slot and may include a number of resource elements. Each resource element may cover one subcarrier in one symbol period and may be used to send one modulation symbol, which may be a real or complex value.

Subframe format 410 may be used for two antennas. A CRS may be transmitted from antennas 0 and 1 in symbol periods 0, 4, 7 and 11. A reference signal is a signal that is known a priori by a transmitter and a receiver and may also be referred to as pilot. A CRS is a reference signal that is specific for a cell, e.g., generated based on a cell identity (ID). In FIG. 4, for a given resource element with label Ra, a modulation symbol may be transmitted on that resource element from antenna a, and no modulation symbols may be transmitted on that resource element from other antennas. Subframe format 420 may be used with four antennas. A CRS may be transmitted from antennas 0 and 1 in symbol periods 0, 4, 7 and 11 and from antennas 2 and 3 in symbol periods 1 and 8. For both subframe formats 410 and 420, a CRS may be transmitted on evenly spaced subcarriers, which may be determined based on cell ID. CRSs may be transmitted on the same or different subcarriers, depending on their cell IDs. For both subframe formats 410 and 420, resource elements not used for the CRS may be used to transmit data (e.g., traffic data, control data, and/or other data).

The PSS, SSS, CRS and PBCH in LTE are described in 3GPP TS 36.211, entitled "Evolved Universal Terrestrial Radio Access (E-UTRA); Physical Channels and Modulation," which is publicly available.

An interlace structure may be used for each of the downlink and uplink for FDD in LTE. For example, Q interlaces with indices of 0 through Q−1 may be defined, where Q may be equal to 4, 6, 8, 10, or some other value. Each interlace may include subframes that are spaced apart by Q frames. In particular, interlace q may include subframes q, q+Q, q+2Q, etc., where $q \in \{0, \ldots, Q-1\}$.

The wireless network may support hybrid automatic retransmission request (HARQ) for data transmission on the downlink and uplink. For HARQ, a transmitter (e.g., an eNB) may send one or more transmissions of a packet until the packet is decoded correctly by a receiver (e.g., a UE) or some other termination condition is encountered. For synchronous HARQ, all transmissions of the packet may be sent in subframes of a single interlace. For asynchronous HARQ, each transmission of the packet may be sent in any subframe.

A UE may be located within the coverage of multiple eNBs. One of these eNBs may be selected to serve the UE. The serving eNB may be selected based on various criteria such as received signal strength, received signal quality, pathloss, etc. Received signal quality may be quantified by a signal-to-noise-and-interference ratio (SINR), or a reference signal received quality (RSRQ), or some other metric. The UE may operate in a dominant interference scenario in which the UE may observe high interference from one or more interfering eNBs.

The focus of traditional LTE design is on the improvement of spectral efficiency, ubiquitous coverage, and enhanced quality of service (QoS) support. Current LTE system downlink (DL) and uplink (UL) link budgets are designed for coverage of high end devices, such as state-of-the-art smartphones and tablets, which may support a relatively large DL and UL link budget.

Thus, as described above, one or more UEs in the wireless communication network (e.g., wireless communication network 100) may be devices that have limited communication resources, such as narrowband UEs, as compared to other (wideband) devices in the wireless communication network. For narrowband UEs, various requirements may be relaxed as only a limited amount of information may need to be exchanged. For example, maximum bandwidth may be reduced (relative to wideband UEs), a single receive radio frequency (RF) chain may be used, peak rate may be reduced (e.g., a maximum of 100 bits for a transport block size), transmit power may be reduced, Rank 1 transmission may be used, and half duplex operation may be performed.

In some cases, if half-duplex operation is performed, narrowband UEs may have a relaxed switching time to transition from transmitting to receiving (or receiving to transmitting). For example, the switching time may be relaxed from 20 µs for regular UEs to 1 ms for narrowband UEs. Release 12 narrowband UEs may still monitor downlink (DL) control channels in the same way as regular UEs, for example, monitoring for wideband control channels in the first few symbols (e.g., PDCCH) as well as narrowband control channels occupying a relatively narrowband, but spanning a length of a subframe (e.g., ePDCCH).

In some systems, for example, in LTE Rel-13, the narrowband may be limited to a particular narrowband assignment (e.g., of no more than six resource blocks (RBs)) within the available system bandwidth. However, the narrowband may be able to re-tune (e.g., operate and/or camp) to different narrowband regions within the available system bandwidth of the LTE system, for example, in order to co-exist within the LTE system.

As another example of coexistence within the LTE system, narrowband UEs may be able to receive (with repetition) legacy physical broadcast channel (PBCH) (e.g., the LTE physical channel that, in general, carries parameters that may be used for initial access to the cell, such as the MIB) and support one or more legacy physical random access channel (PRACH) formats. For example, the narrowband UEs may be able to receive the legacy PBCH with one or more additional repetitions of the PBCH across multiple subframes. As another example, the narrowband UEs may be able to transmit one or more repetitions of PRACH (e.g., with one or more PRACH formats supported) to an eNB in the LTE system. The PRACH may be used to identify the narrowband UE. Also, the number of repeated PRACH attempts may be configured by the eNB.

The narrowband UE may also be a link budget limited device and may operate in different modes of operation (e.g. entailing different amounts of repeated messages transmitted to the narrowband UE) based on its link budget limitation. For example, in some cases, the narrowband UE may operate in a normal coverage mode in which there is little to no repetition (i.e., the amount of repetition needed for the UE to successfully receive a message may be low or repetition may not even be needed). Alternatively, in some cases, the narrowband UE may operate in a coverage enhancement (CE) mode in which there may be high amounts of repetition. For example, for a 328 bit payload, a narrowband UE in CE mode may need 150 or more repetitions of the payload in order to successfully receive the payload.

In some cases, for example, for LTE Rel-13, the narrowband UE may have limited capabilities with respect to its reception of broadcast and unicast transmissions. For example, the maximum transport block (TB) size for a broadcast transmission received by the narrowband UE may be limited to 1000 bits. Additionally, in some cases, the narrowband UE may not be able to receive more than one unicast TB in a subframe. In some cases (e.g., for both the CE mode and normal mode described above), the narrowband UE may not be able to receive more than one broadcast TB in a subframe. Further, in some cases, the narrowband UE may not be able to receive both a unicast TB and a broadcast TB in a subframe.

Narrowband UEs that co-exist in the LTE system may also support new messages for certain procedures, such as paging, random access procedure, etc. (e.g., as opposed to conventional messages used in LTE for these procedures). In other words, these new messages for paging, random access procedure, etc. may be separate from the messages used for similar procedures associated with non-narrowband UEs. For example, as compared to conventional paging messages used in LTE, narrowband UEs may able to monitor and/or receive paging messages that non-narrowband UEs may not able to monitor and/or receive. Similarly, as compared to conventional random access response (RAR) messages used in a conventional random access procedure, narrowband UEs may be able to receive RAR messages that also may not be able to be received by non-narrowband UEs. The new paging and RAR messages associated with narrowband UEs may also be repeated one or more times (e.g., "bundled"). In addition, different numbers of repetitions (e.g., different bundling sizes) for the new messages may be supported.

According to certain aspects, multiple narrowband regions, with each narrowband region spanning a bandwidth that is no greater than a total of 6 RBs, may be supported by narrowband UE and/or narrowband operation. In some cases, each narrowband UE in narrowband operation may operate within one narrowband region (e.g., at 1.4 MHz or 6 RBs) at a time. However, narrowband UEs in narrowband operation, at any given time, may re-tune to other narrowband regions in the wider system bandwidth. In some examples, multiple narrowband UEs may be served by the same narrowband region. In other examples, multiple narrowband UEs may be served by different narrowband regions (e.g., with each narrowband region spanning 6 RBs). In yet other examples, different combinations of narrowband UEs may be served by one or more same narrowband regions and/or one or more different narrowband regions.

Some systems, for example, in LTE Rel-13, introduce coverage enhancements and support for narrowband UEs, as well as other UEs. As used herein, the term coverage enhancement generally refers to any type of mechanism that extends the coverage range of a device (such as a narrowband device) within a network. One approach for coverage enhancement (CE) is bundling which refers to transmitting the same data multiple times (e.g., across multiple subframes or, as will be described in greater detail below, across multiple symbols within a same subframe).

In certain systems, narrowband UEs may support narrowband operation while operating in a wider system bandwidth. For example, a narrowband UE may transmit and receive in a narrowband region of a system bandwidth. As noted above, the narrowband region may span 6 resource blocks (RBs).

Certain systems may provide narrowband UEs with coverage enhancements of up to 15 dB, which maps to 155.7 dB maximum coupling loss between the UE and an eNB. Accordingly, narrowband UEs and eNB may perform measurements at low SNRs (e.g., −15 dB to −20 dB). In some systems, coverage enhancements may include channel bundling, wherein messages associated with narrowband UEs may be repeated (e.g., bundled) one or more times.

Certain devices may be able to communicate both with legacy type communications and non-legacy type communications. For example, some devices may be able to communicating in both narrowband regions (of overall system bandwidth) as well as wider band regions. While the examples above refer to low cost or MTC devices that communicate via narrowband regions, other (non-low-cost/non-MTC) types of devices may also communicate vie narrowband regions, for example, taking advantage of frequency selectivity and directional transmissions.

Devices may communicate using relative narrowband regions of system bandwidth, such as narrowband internet of things (NB-IoT) devices. To reduce the complexity of UEs, NB-IoT may allow for deployments utilizing one Physical Resource Block (PRB) (180 kHZ+20 kHZ guard band). NB-IoT deployments (e.g., utilizing 1 RB) may utilize higher layer components of LTE and hardware to allow for reduced fragmentation and cross compatibility with, for example, NB-LTE and eMTC (enhanced MTC).

Figure 5:
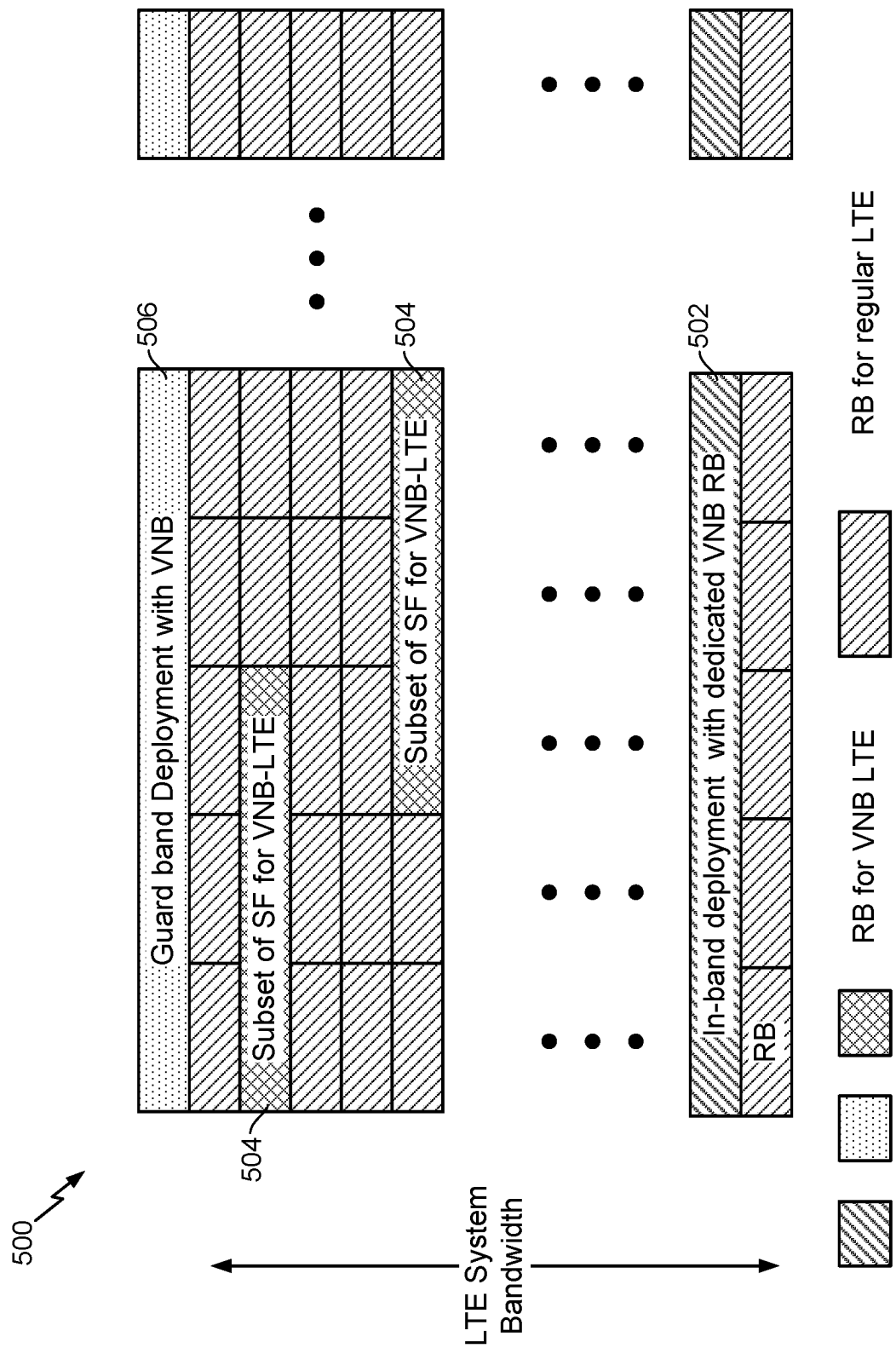
FIG. 5 illustrates an example deployment of NB-IoT, according to certain aspects of the present disclosure.

FIG. 5 illustrates an example deployment 500 of NB-IoT, according to certain aspects of the present disclosure. According to certain aspects, NB-IoT may be deployed in three broad configurations. In certain deployments, NB-IoT may be deployed in-band and coexist with legacy GSM/WCDMA/LTE system(s) deployed in the same frequency band. Wideband LTE channel, for example, may be deployed in various bandwidths between 1.4 MHz to 20 MHz, and there may be a dedicated RB 502 available for use by NB-IoT, or the RBs allocated for NB-IoT may be dynamically allocated 504. In an in-band deployment, one resource block (RB), or 200 kHz, of a wideband LTE channel may be used for NB-IoT. LTE implementations may include unused portions of radio spectrum between carriers to guard against interference between adjacent carriers. In some deployments, NB-IoT may be deployed in a guard band 506 of the wideband LTE channel. In other deployments, NB-IoT may be deployed standalone (not shown). In a standalone deployment, one 200 mHz carrier may be utilized to carry NB-IoT traffic and GSM spectrum may be reused.

Deployments of NB-IoT, may include synchronization signals such as PSS for frequency and timing synchronization and SSS to convey system information. According certain aspects of the present disclosure, synchronization signals of NB-IoT operations occupy narrow channel bandwidths and can coexist with legacy GSM/WCDMA/LTE system(s) deployed in the same frequency band. NB-IoT operations may include PSS/SSS timing boundaries. In certain aspects, these timing boundaries may be extended as compared to the existing PSS/SSS frame boundaries in legacy LTE systems (e.g., 10 ms) to, for example, 40 ms. Based on the timing boundary, a UE is able to receive a PBCH transmission, which may be transmitted in subframe 0 of a radio frame.

Figure 6:
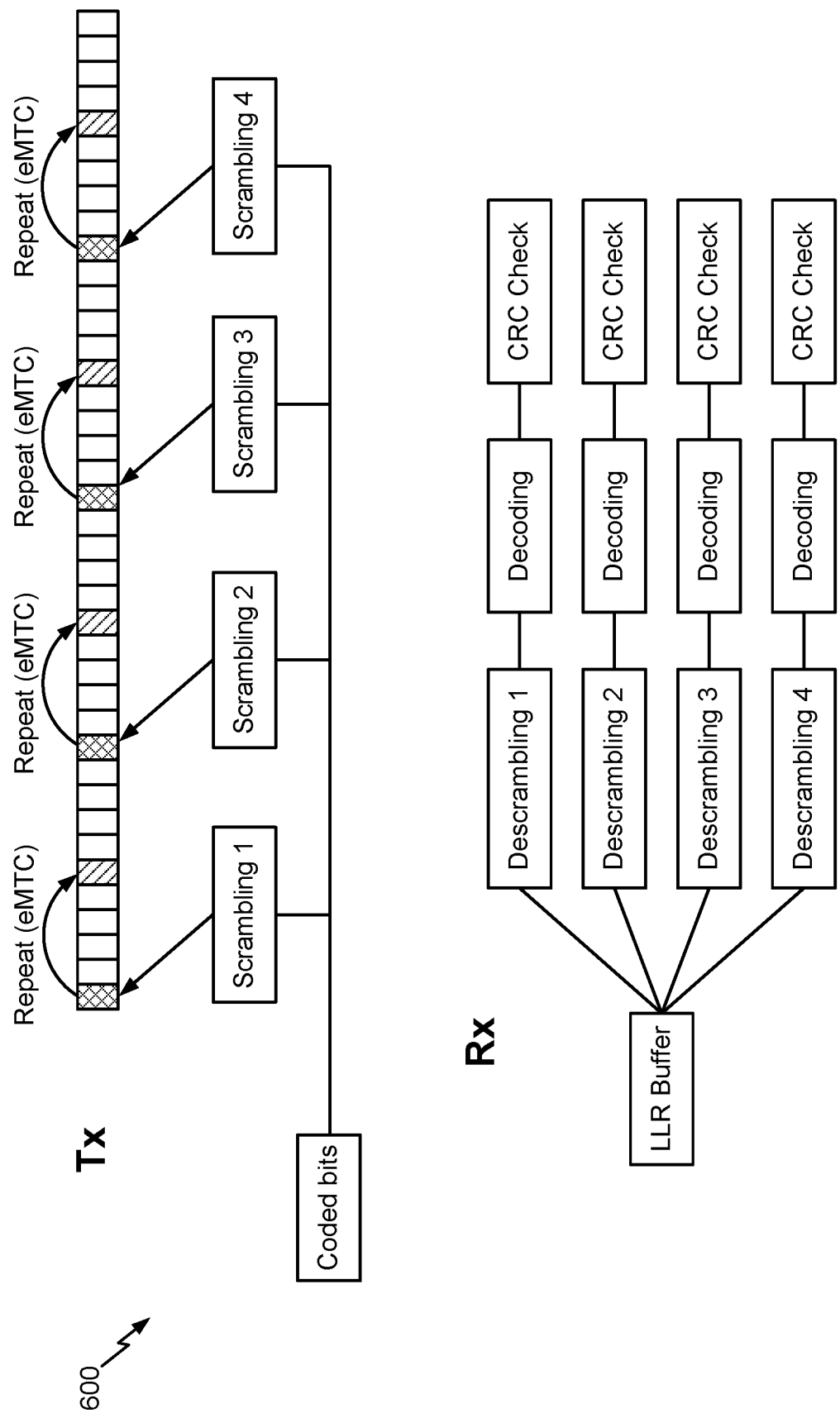
FIG. 6 illustrates an example LTE PBCH process, according to certain aspects.

FIG. 6 illustrates an example LTE PBCH process 600, according to certain aspects. In legacy LTE, the PBCH periodicity is 40 ms and PBCH symbols may be updated every 40 ms. The 40 ms interval is not explicitly indicated to the UE, but may be determined implicitly from the scrambling and bit positions of the PBCH. As the PBCH may be transmitted in each radio frame, the PBCH may be transmitted every 10 ms with the same payload across a 40 ms transmission period for a total of four retransmissions 602. Additionally, the PBCH symbols may be scrambled based on one of four possible phases of the PBCH scrambling code. Absent combining, in legacy LTE, a UE may attempt four blind decodes 606, one for each PBCH scrambling code 604, and calculate and check a cyclic redundancy check (CRC) from each blind decode 608 in a log likelihood ratio (LLR) buffer 610.

Figure 7:
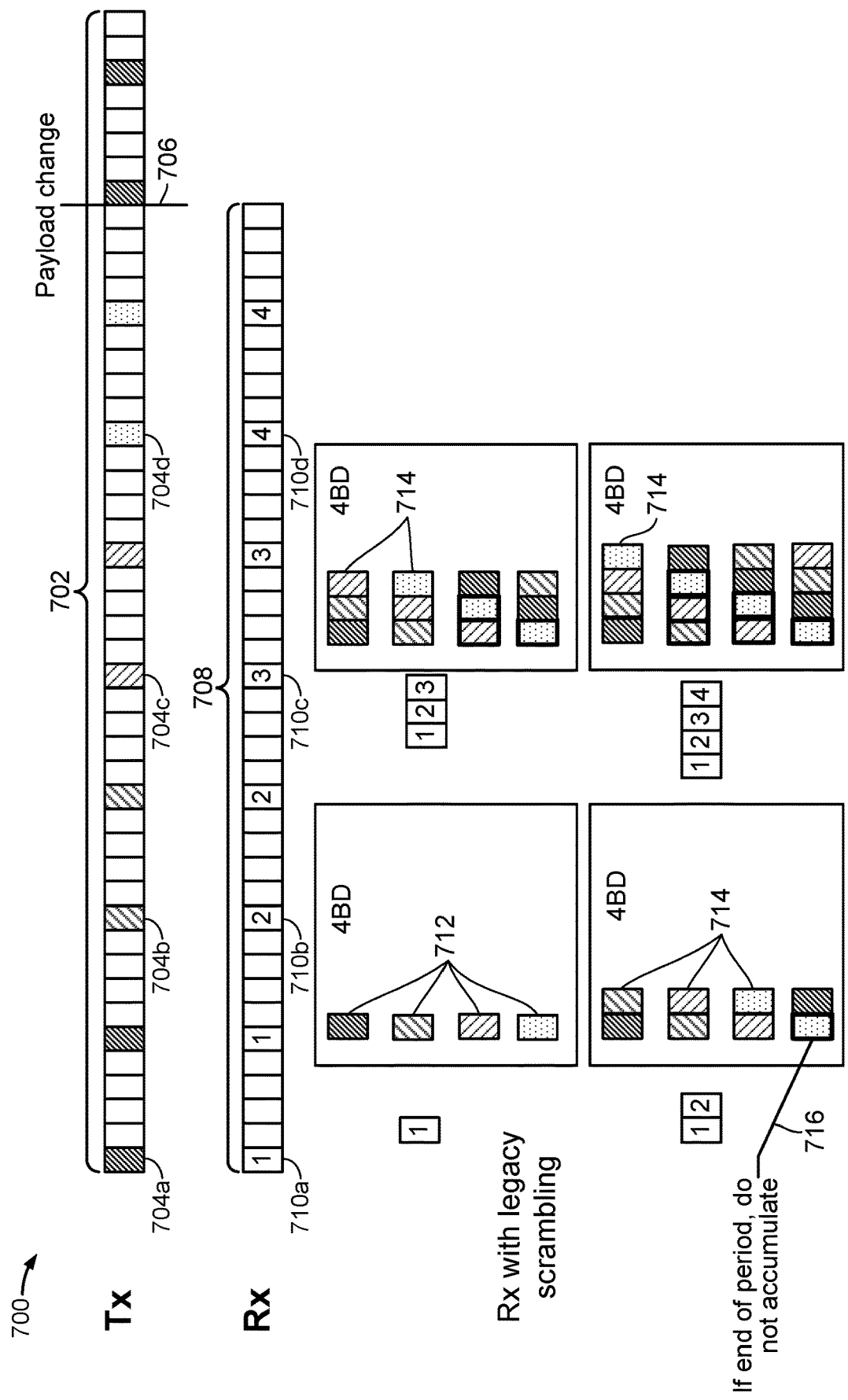
FIG. 7 illustrates an example LTE PBCH blind decode process 700, according to certain aspects.

FIG. 7 illustrates an example LTE PBCH blind decode process 700, according to certain aspects. A transmitter may transmit a set of subframes, 702, over a 40 ms PBCH update interval, four repetitions of the PBCH symbols 704*a-d* where each repetition is scrambled with a code that is initialized in step with the PBCH update, for a total of four possible scrambling codes. The scrambling is reset at the end of the period 706 where the payload may also change. A receiver may receive a set of subframes 708 including repetitions of the PBCH symbols 710*a-d*. The receiver may then attempt to decode the PBCH symbols by attempting four blind decodes 712 of the first repetition of the PBCH symbols 710*a*, one for each possible scrambling code. After descrambling, a CRC check may be performed to determine the scrambling code used for each decoded candidate, for a total of four CRC checks.

A repeated PBCH transmission may be combined in buffers 714 with a previously transmitted PBCH for decoding. This combining may be performed, for example, over the 40 ms PBCH update interval. Each additional combination candidate is combined with the PBCH candidate symbols already received, decoded and CRC checked. If the CRC check passes prior to the end of the update interval, then the combining is successful and the PBCH successfully decoded. If the end of the update interval 716 is reached without a successful decoding, then symbols previously received are not used for combining. Where PBCH is combined over four repetitions, a total of 16 blind decodes may be necessary over the 40 ms period.

According to certain aspects, for NB-IoT, may extend PBCH timing periods to allow for extended coverage. For example, the PBCH update period may be extended, to 640 ms while PSS/SSS may only provide a lower time boundary, for example, of 80 ms. In such a case, eight blind decodes may be needed absent combining. However, performing a number of blind decodes for relatively simple, low cost devices may consume more resources than necessary.

Example Design of Physical Broadcast Channel (PBCH) and Master Information Block (MIB)

As noted above, aspects of the present disclosure provide techniques for the design of PBCH and MIB signals for narrowband devices, such as NB-IoT devices, in a wireless communication network. NB-IoT devices may be relatively simple, low powered devices. Instead of performing multiple blind decodes, such devices may be configured to perform a reduced number of decode steps and apply a set of cyclic shifts with redundancy checks to obtain the bits.

Figure 8:
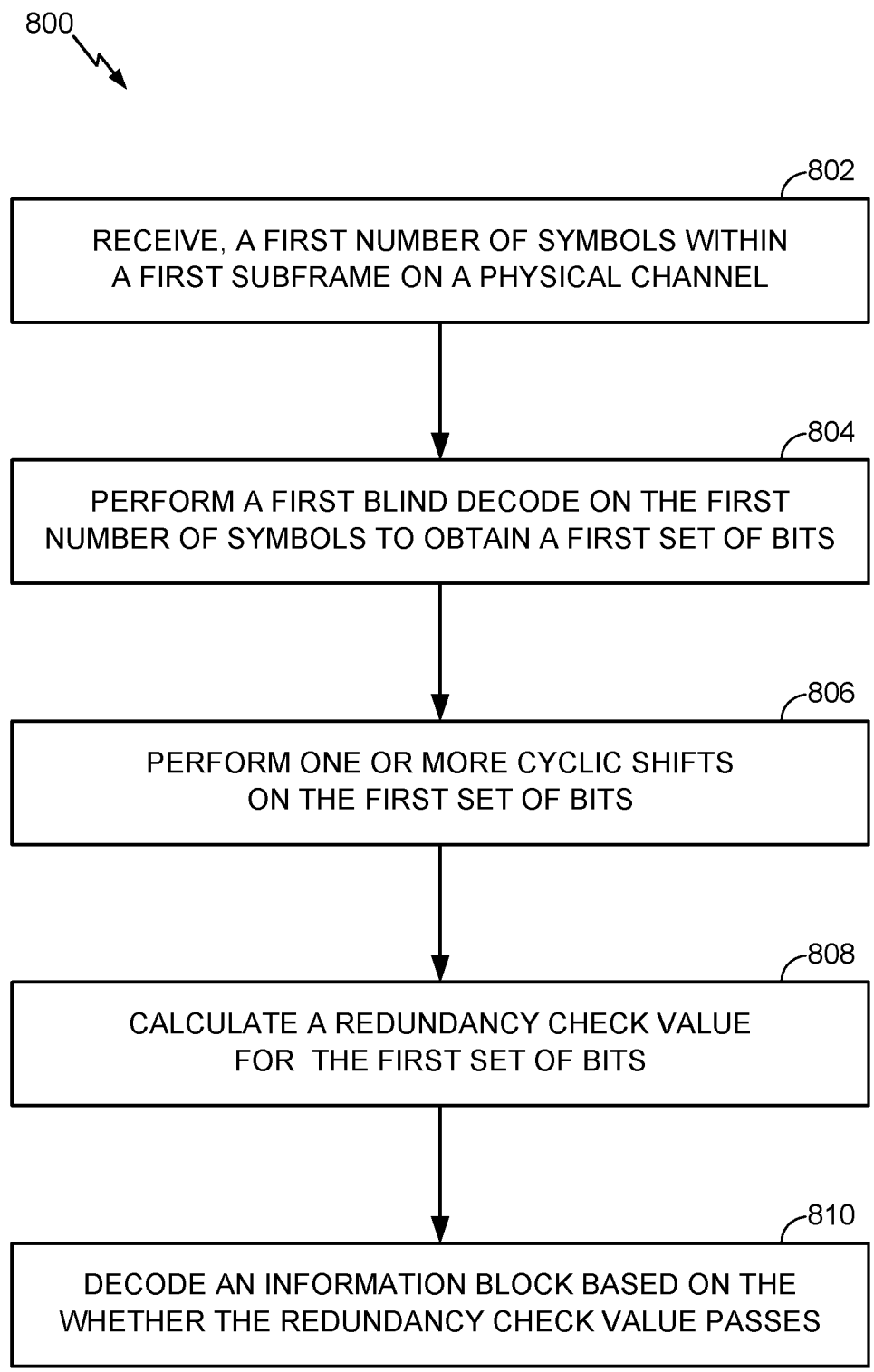
FIG. 8 illustrates an example reduced number of blind decode process that may be performed by a user equipment, in accordance with certain aspects of the present disclosure.

FIG. 8 illustrates example reduced number of blind decode (BD) process 800 that may be performed by a user equipment, in accordance with certain aspects of the present disclosure. At block 802, receiving, a first number of symbols within a first subframe on a physical channel. At block 804, performing a first blind decode on the first number of symbols to obtain a first set of bits. At block 806, performing one or more cyclic shifts on the first set of bits. At block 808, calculating a redundancy check value for the first set of bits, and at block 810, decoding an information block based on the whether the redundancy check value passes. It should be noted that while the terms frame and subframe are used herein generally refer to particular time intervals over which a set of symbols may be sent or received in reference to LTE terminology for convenience, the terminology is not intended to be limiting and other terminology may be used without departing from the scope of this disclosure. Similarly, the MIB refers to information broadcast by a cell containing information, such as system bandwidth, downlink control channel information, or frame number, which may be used for initial access to the cell.

Figure 9:
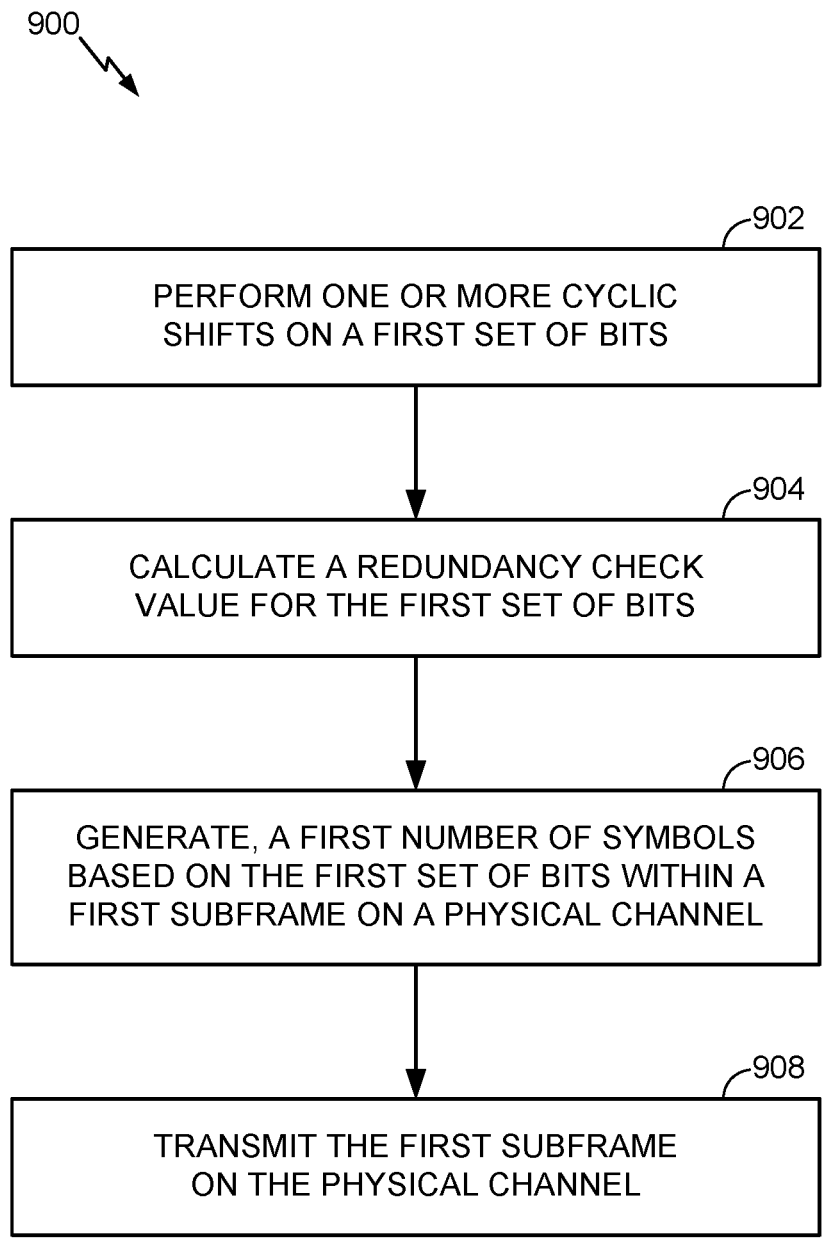
FIG. 9 illustrates example reduced number of blind decode process what may be performed by a base station, in accordance with certain aspects of the present disclosure.

FIG. 9 illustrates example reduced number of blind decode process 900 what may be performed by a base station, in accordance with certain aspects of the present disclosure. At 902, calculating a redundancy check value for a first set of bits. At 904, performing one or more cyclic shifts on the first set of bits. At 906, generating, a first number of symbols based on the first set of bits and the redundancy check value within a first subframe on a physical channel. At 908, transmitting the first subframe on the physical channel.

Figure 10:
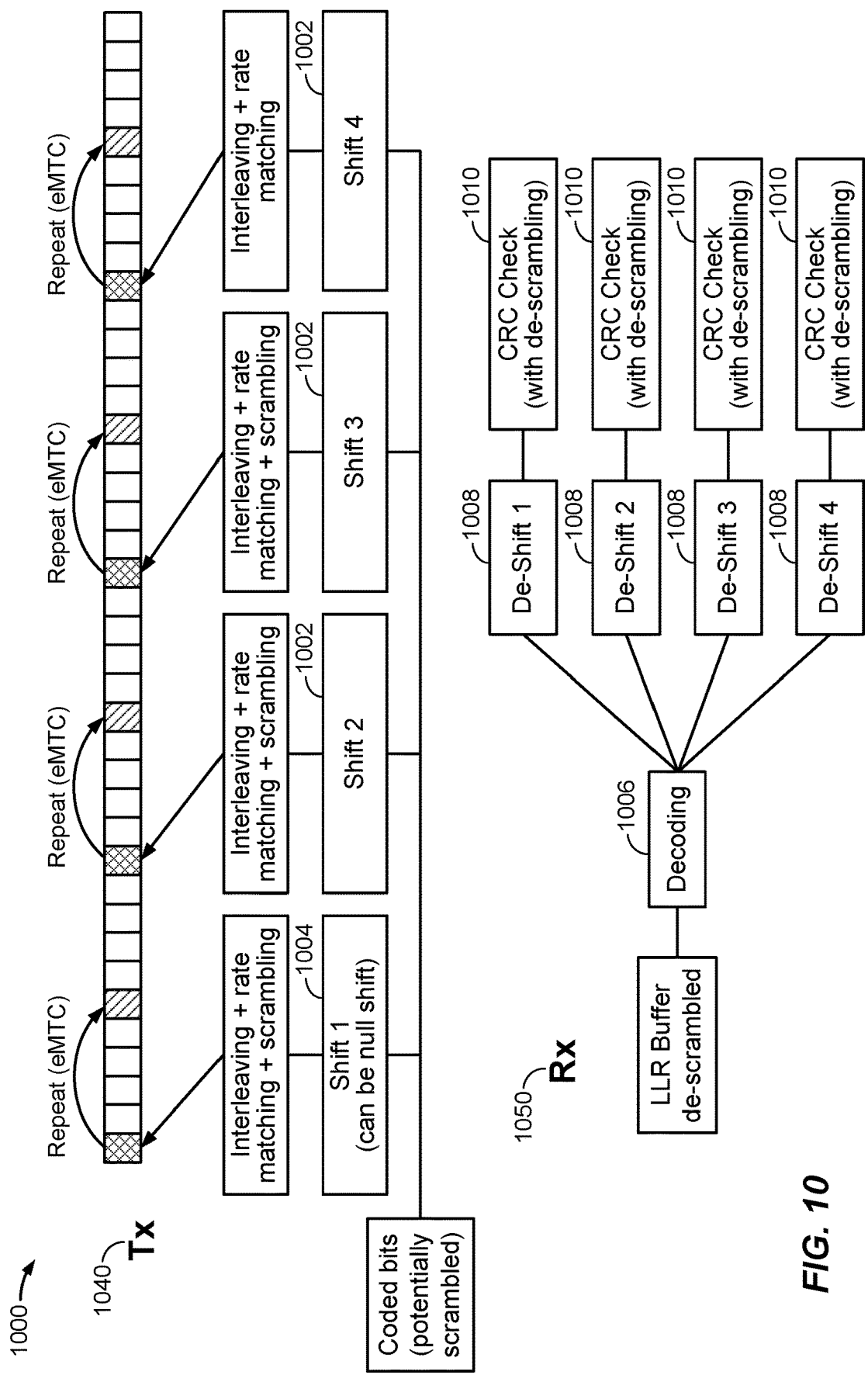
FIG. 10 illustrates example an example PBCH process, according to certain aspects of the present disclosure.

FIG. 10 illustrates example an example PBCH process 1000, according to certain aspects of the present disclosure. To reduce the number of blind decodes required for PBCH, rather than using a scrambling code that is reinitialized at the start of each update cycle, a different cyclic shift may be applied to the coded bits for each repetition. For example, a 1/3 tail-biting convolution code (TBCC) may be applied by transmitter 1040 to the PBCH payload of 40 bits with three output streams of 40 bits each. A cyclic shift 1002 may be applied separately on each of these three output streams. According to certain aspects, a cyclic shift of one coded bit in the coded payload is equivalent to performing one cyclic shift on un-encoded bits, based on TBCC properties, and applying the cyclic shift to the coded and uncoded bits are equivalent. A null shift 1004, or no shift may be applied to the initial transmission at the beginning of a PBCH update cycle. In addition, coding bits may need to be calculated for each subframe.

A receiver 1050 may then perform one blind decode 1006 to obtain the decoded bits and apply a set of cyclic shifts 1008 over the decoded bits. According to certain aspects, a blind decode, in addition to de-scrambling may also include de-interleaving, which may reassemble symbols shuffled across multiple code words, and de-rate matching, which may match the number of symbols received to the number of bits in a transport block. The receiver 1050 may perform a redundancy check 1010 on each set of bits resulting from a particular cyclic shift 1008. The redundancy check 1010 may, for example, be a CRC check. The cyclic shifts 1008 and redundancy checks 1010 may be performed in parallel, in a manner similar to blind decoding, but with one decode, four cyclic shifts, and four redundancy checks on the candidate.

The redundancy check 1010 may be a cyclic code which has a property such that for bits on which the redundancy check is performed, any cyclic shift of those bits will also pass the redundancy check. According to certain aspects of the present disclosure, the redundancy check may be modified to avoid this property. This may be performed by any known methodology. For example, the redundancy check may be scrambled with a known sequence and descrambled prior to the redundancy check or the redundancy check ordering may be reversed and the redundancy check performed from least significant bit to most significant bit.

According certain aspects of the present disclosure, when combining multiple subfames, the coded log likelihood ratios (LLRs) of a given subframe may also be shifted to align with the LLRs of the previous subframe. However, the absolute offset need not be known as the cyclic shift is relative to the previous subframe and the absolute offset may be obtained in the redundancy check phase.

According to certain aspects of the present disclosure, if multiple repetitions are expected to occur within a certain boundary, such as within 80 ms, the same bits previously transmitted may be repeated. Additionally, the same cyclic shifts may be used within this boundary.

According to certain aspects, the complexity of decoding PBCH based on a cyclic shift increases with combining if decoding is performed optimally for longer observation times. For example, in the worst case scenario, the complexity for decoding a cyclic shifted PBCH may be equal to the complexity for blind decoding a scrambled PBCH. In other cases, the number of blind decodes is reduced.

Figure 11:
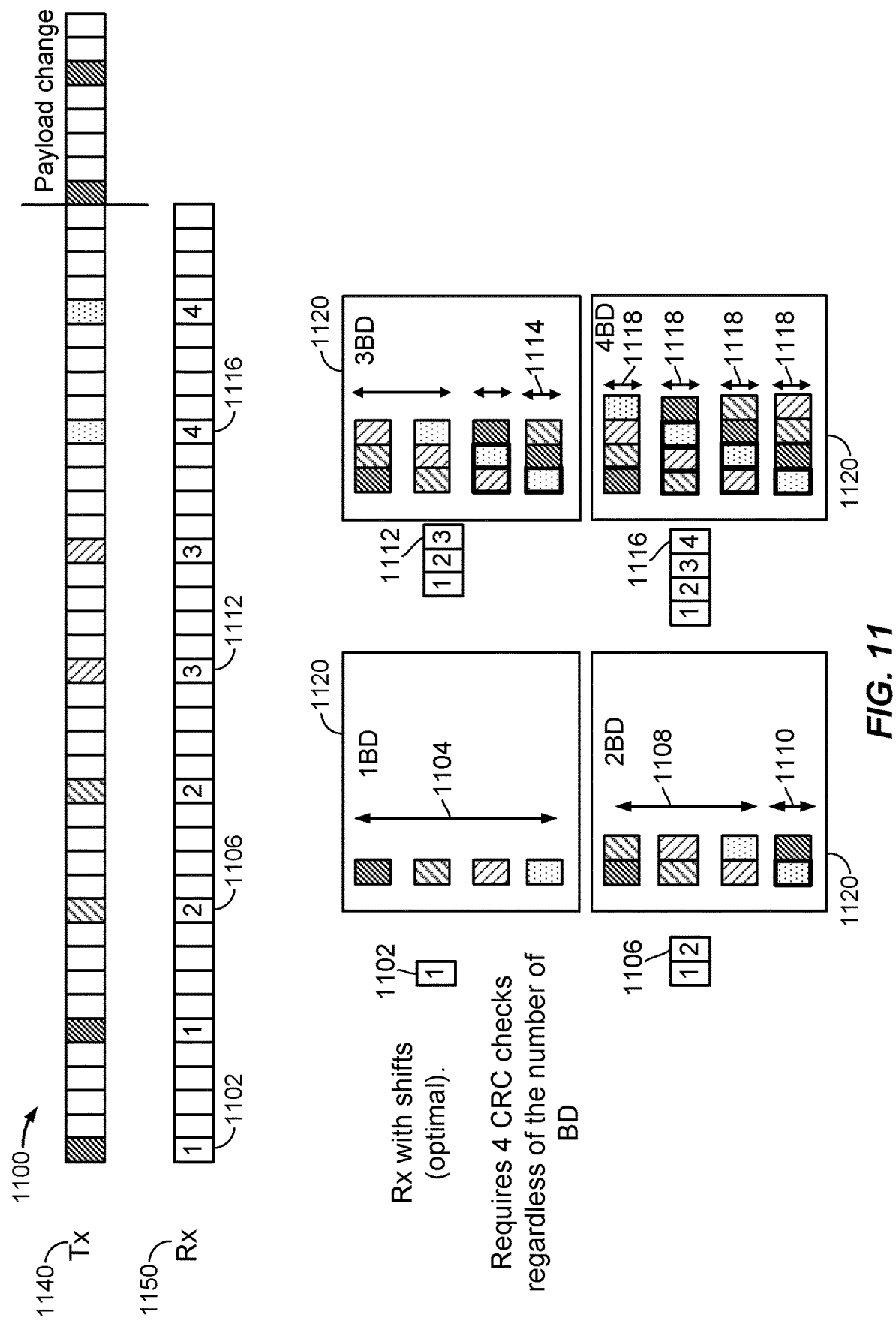
FIG. 11 illustrates an example PBCH cyclic shift process, according to certain aspects of the present disclosure.

FIG. 11 illustrates an example PBCH cyclic shift process 1100, according to certain aspects of the present disclosure. A receiver 1150 may receive a subframe 1102 including a first set of PBCH symbols. The receiver 1150 may perform one blind decoding 1104 of the PBCH, four cyclic shifts, and four redundancy checks, as described in conjunction with FIG. 10 in an LLR buffer 1120. The receiver 1150 may then receive a second subframe 1106 including a second, repeated, set of PBCH symbols, which may be combined with the first set of PBCH symbols received in subframe

1102. The receiver may perform two blind decodes in the LLR buffer where a first blind decode 1108 encompassing repetitions within a PBCH update interval. A second blind decode 1110 is also performed as packets may not be combined after the end of a PBCH update period. Similarly with a reception of a third subframe 1112, a third blind decode 1114 may be required. With a fourth subframe 1116, four blind decodes 1118 may be required where decoding is performed optimally for receiving and decoding of the PBCH symbols.

Figure 12:
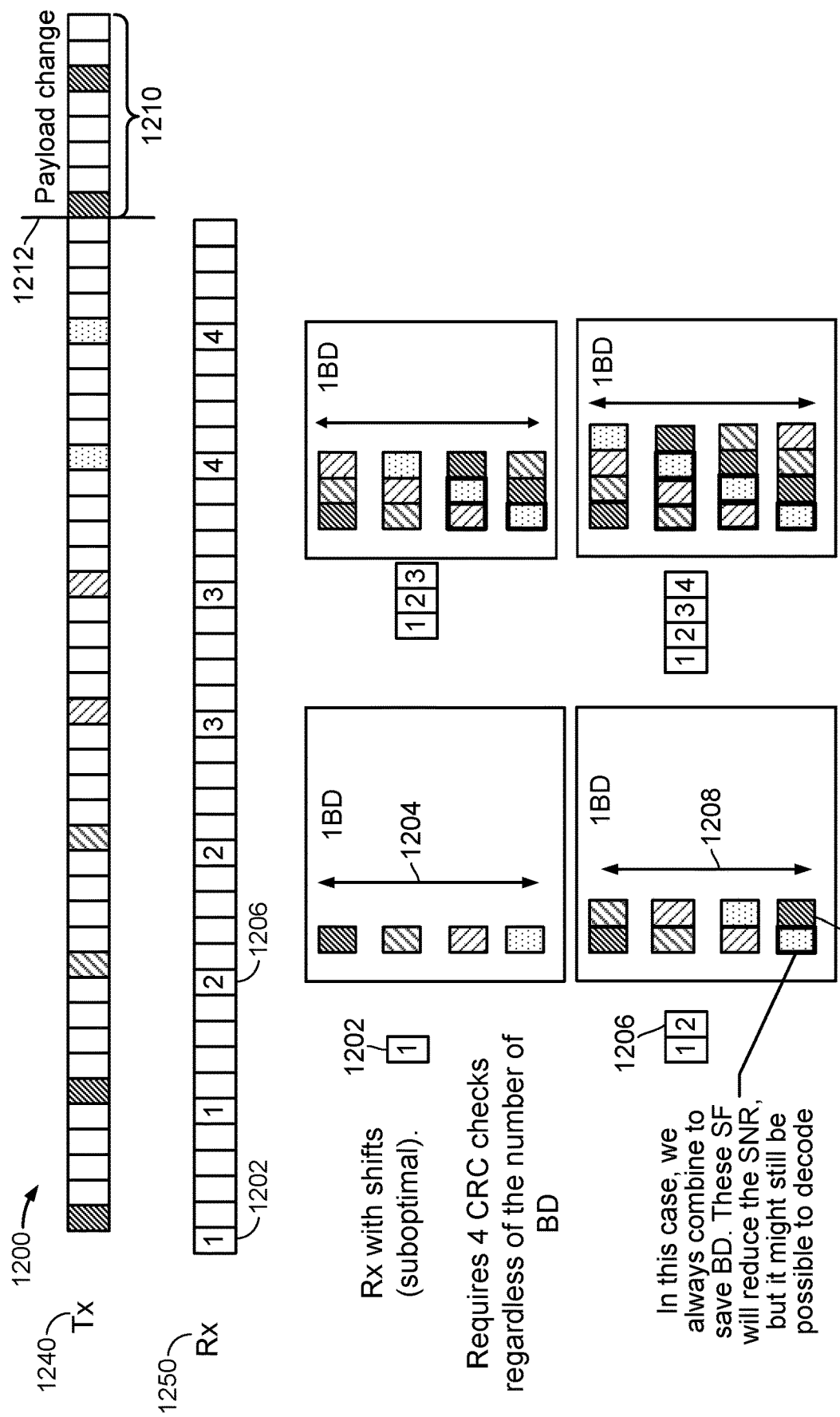
FIG. 12 illustrates an example PBCH cyclic shift process, according to certain aspects of the present disclosure.

FIG. 12 illustrates an example PBCH cyclic shift process 1200, according to certain aspects of the present disclosure. The receiver 1250 may perform one blind decoding 1204 of the set of PBCH symbols, four cyclic shifts, and four redundancy check, as described in conjunction with FIG. 10. The receiver 1250 may then receive a second subframe 1206 including a second, repeated, set of PBCH symbols, which may be combined with the first set of PBCH symbols 1202. In the suboptimal case, one blind decoding 1208 and combining is performed for all repetitions, including subframes 1210 received outside of a particular PBCH update interval 1212. Where combining is attempted across the PBCH update interval, the payload of the PBCH may be different. This may result in an increase in noise and a reduced SINR, but decoding may still be possible. In this case, the number of blind decodes is kept to a minimum reduced complexity, with a tradeoff of some decoding performance and increased latency.

According to certain aspects of the present disclosure, intermediate scenarios may also be available between the single blind decode and optimal scenarios with up to four blind decodes in order to balance the tradeoff between decoding performance and blind decoding capability. For example, a receiver may be able to perform two blind decodes with combining across a PBCH update interval once two blind decodes are performed. An intermediate scenario may enable more tailored blind decoding complexity levels. For example, a very low complexity UE may be limited to performing only one blind decode, while a medium complexity UE may be able to perform two blind decodes, and a high complexity UE may be able to perform four blind decodes.

In other aspects, a UE may be able to adjust the number of blind decodes based on various conditions. For example, where a UE detects a good SNR on a connection, the UE may perform only one blind decode and where the SNR does not reach a particular threshold value, perform two or four blind decodes. Other conditions where a UE may adjust the number of blind decodes to perform may include battery conditions, target power consumption, and the like.

Example Operating Modes Based on Deployment Scenarios

As noted above, NB-IoT may be deployed in-band in conjunction with other wireless networks, such as LTE, or as stand-alone deployments. According to aspects for the present disclosure, based on the deployment type, an operating mode for NB-IoT may be determined. For example, based on the deployment type, a resource element mapping, information about a PBCH payload, such as size or how to interpret the contents of the payload, the number of repetitions per frame, the scrambling sequence, or the time during which the PBCH payload remains unchanged may be determined.

Where a NB-IoT network is deployed in band, information about the location of the PBCH and MIB may be carried in a wideband location, separate from the narrowband. In addition, in-band and stand-alone deployments may have different SNRs for the same pathloss, and thus require different code rates and repetition levels to achieve the same coverage.

FIG. 13 illustrates example power levels for various NB-IoT deployments, according to certain aspects of the present disclosure. In a standalone configuration, a cell may have 43 dBm of transmission power available and all of the available power may be available for transmission of the PBCH. In the in-band configuration, a cell may need to divide the available power across the RBs to be transmitted and thus reducing the power available to transmit the PBCH for NB-IoT. In the worst case, an in-band deployment may lose up to 17 dB of power and need approximately 10 times fewer repetitions to achieve the same coverage levels as compared to the stand-alone or guard-band deployments.

According to certain aspects of the present disclosure, stand-alone deployments may be bandwidth constrained as compared to in-band deployments as stand-alone deployments are generally limited to approximately 200 kHz of bandwidth, while in-band deployments may utilized different RBs with RF retuning after the initial acquisition.

Figure 14:
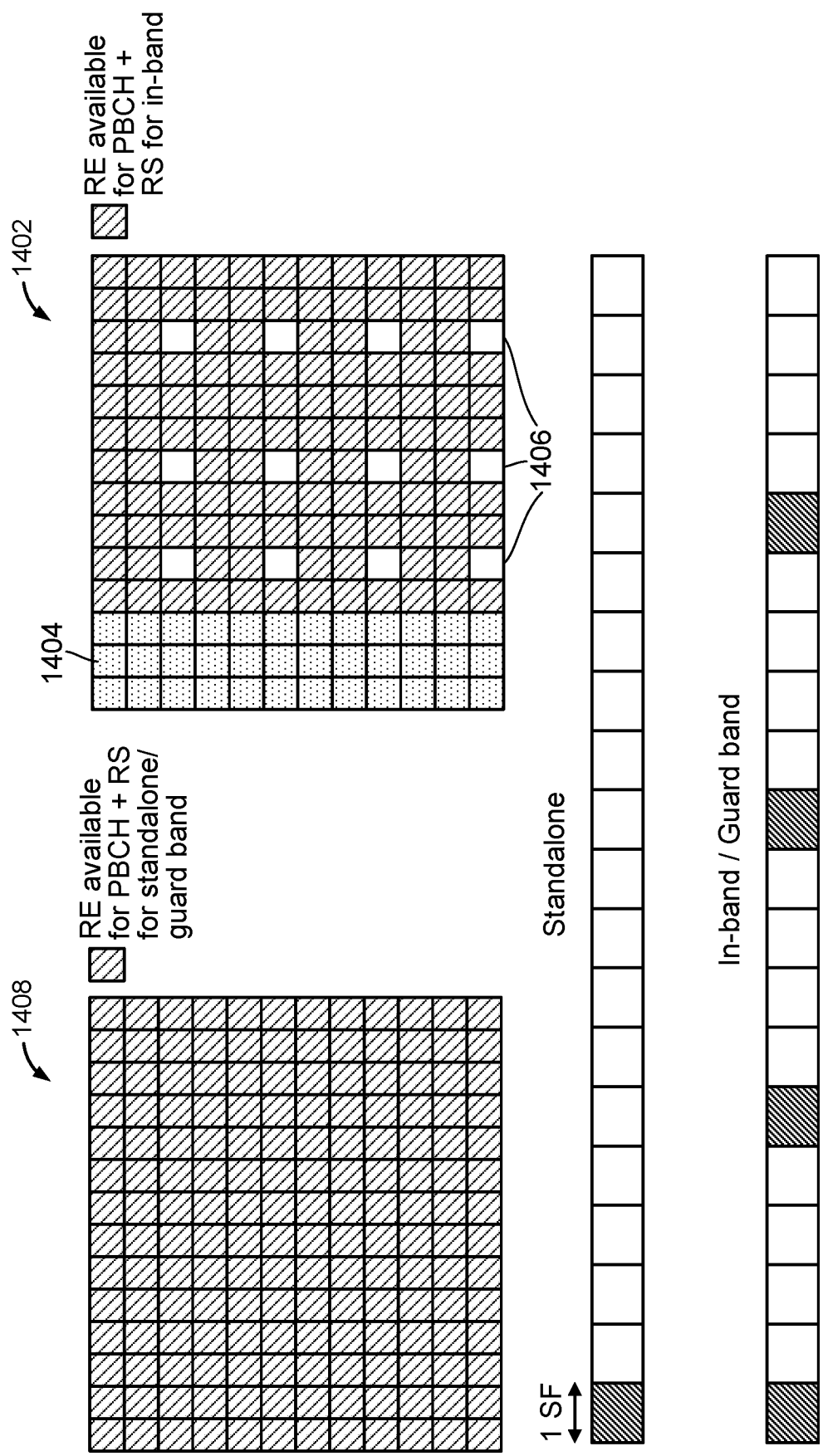
FIG. 14 illustrates example resource mapping for various NB-IoT deployments, according to certain aspects of the present disclosure.

FIG. 14 illustrates example resource mapping for various NB-IoT deployments, according to certain aspects of the present disclosure. In-band deployments 1042 may only be able to utilize a subset of the available resources due to collisions with legacy LTE signals and channels. For example, the first three OFDM symbols 1404 may be utilized for legacy PDCCH and LTE CRS tones 1406 should not be used for NB-IoT. A stand-alone or guard band deployment 1408 may not have similar limitations and may be able to utilize all the RE available. Taking into account symbols that may be unavailable, an in-band deployment may have 35% fewer resource elements available, or 108 resource elements available for in-band as compared to 168 resource elements for stand-alone.

Figure 15:
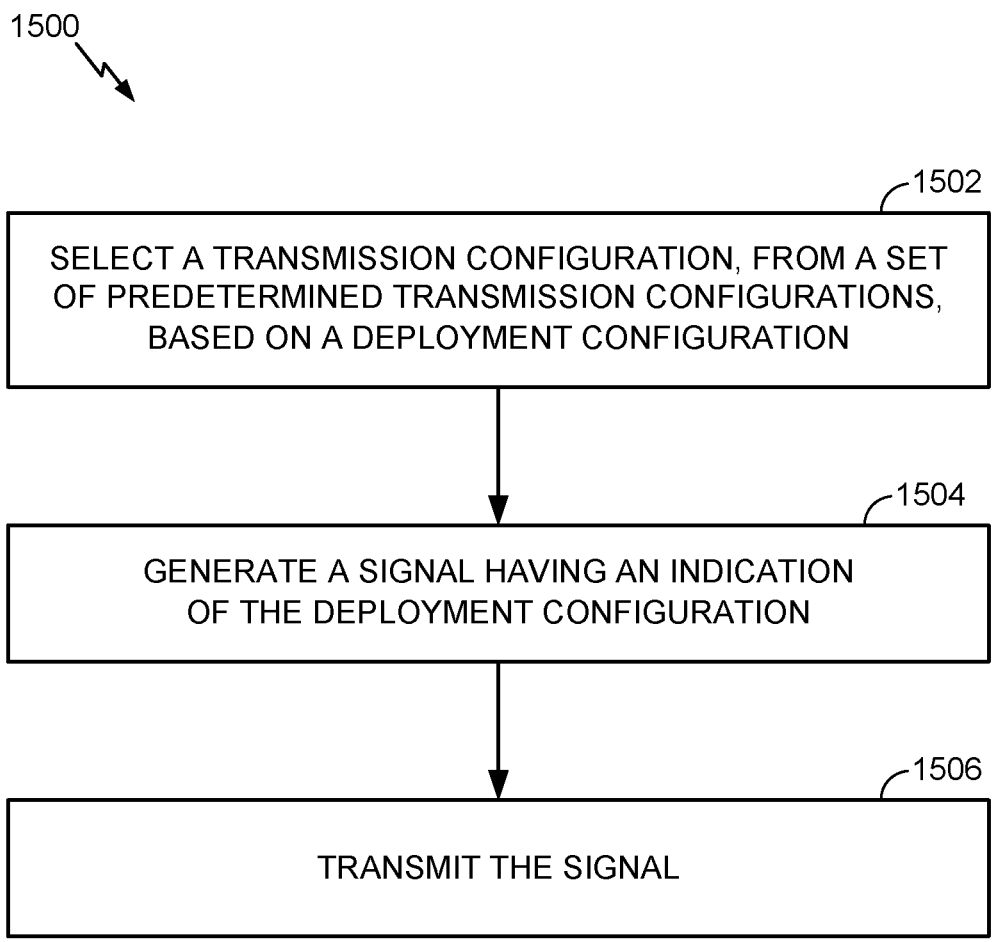
FIG. 15 illustrates an example transmission configuration operation for wireless communications by a base station (BS), in accordance with certain aspects of the present disclosure.

FIG. 15 illustrates an example transmission configuration operation 1500 for wireless communications by a base station (BS), in accordance with certain aspects of the present disclosure. At block 1502, selecting a transmission configuration, from a set of predetermined transmission configurations, based on a deployment configuration. At block 1504, generating a signal having an indication of the deployment configuration. At block 1506, transmitting the signal.

Figure 16:
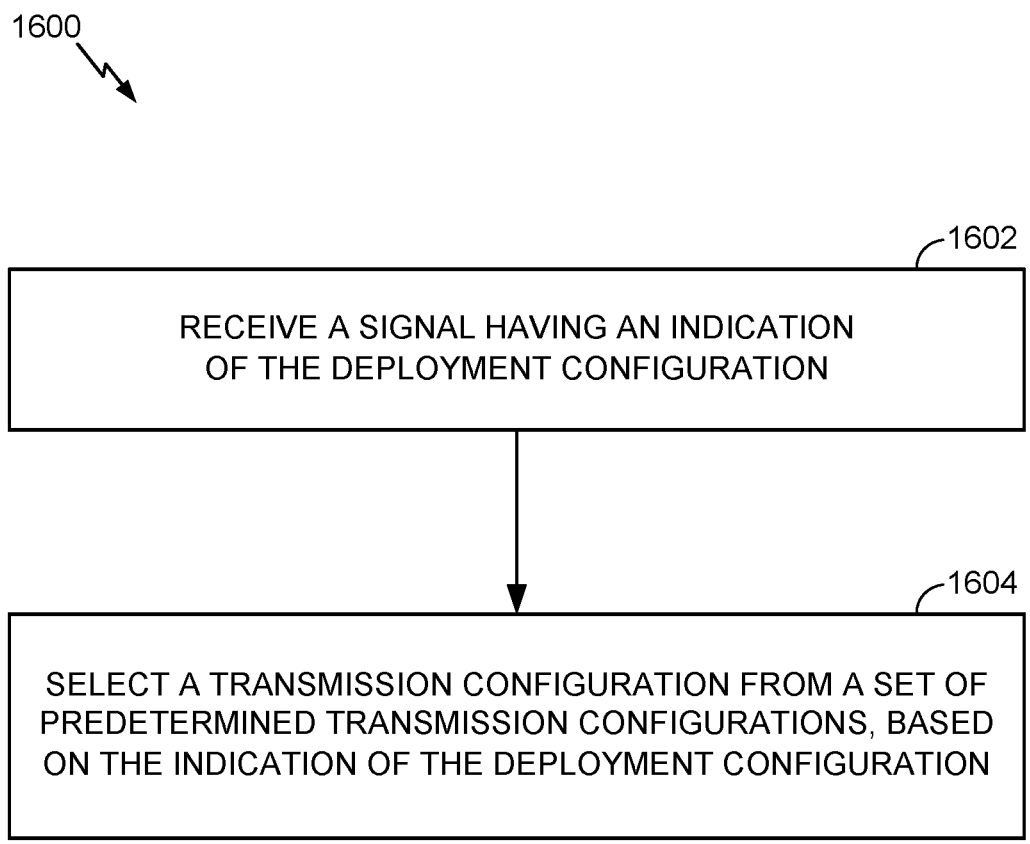
FIG. 16 illustrates example transmission configuration operations for wireless communications by a user equipment (UE), in accordance with certain aspects of the present disclosure.

FIG. 16 illustrates example transmission configuration operations 1600 for wireless communications by a user equipment (UE), in accordance with certain aspects of the present disclosure. At block 1602, receiving a signal having an indication of the deployment configuration. At block 1604, selecting a transmission configuration from a set of predetermined transmission configurations, based on the indication of the deployment configuration.

According to some aspects of the present disclosure, guard band deployments for NB-IoT may have available a comparable amount of resource elements and utilize a tone mapping as compared to stand-alone deployments. However, if the NB-IoT deployment and another wireless network, for example, LTE, deployment are co-located, the transmission power available may be split between NB-IoT and the other wireless network. According to certain aspects, for guard band deployments, the repetition level may be the same as for in-band deployments. Additionally, a guard band deployment of NB-IoT may share a power amplifier with another wireless network, such as LTE. In such cases, the power spectral density (PSD) of the NB-IoT may be similar to that of in-band deployments. Where the power amplifier is not shared, the PSD of the guard band deployment may be larger than the PSD of an in-band deployment.

According to some aspects of the present disclosure, as in-band and guard band deployments of NB-IoT may have less available transmission power as compared to stand-alone deployments, in-band and guard band deployments may require a larger number of repetitions per radio frame as compared to stand-alone. However, even with a larger number of repetitions, a longer combining timing may be required. According to certain aspects, the update rate of PBCH may be based on the deployment configurations. For example, in a stand-alone deployment, the PBCH update period may be 80 ms and the PBCH may change after the 80 ms. For an in-band or guard band deployments, the PBCH may be changed every 640 ms for x8 combining gain.

According to some aspects of the present disclosure, as an operating mode may be based on a deployment type. If the deployment type can be determined by a UE, the UE may be able to hypothesize information about the operating mode and attempt to, for example, decode PBCH based on the hypothesized information. A UE may be configured to determine the deployment type for a NB-IoT based on the PSS and SSS signal. For example, the PSS or SSS may include an indication, such as a defined scrambling sequence, based on deployment types. Other examples may include defined PSS/SSS densities where how often the PSS/SSS is repeated may indicate the deployment type, or defined separations between the PSS and SSS.

Where the PSS and SSS do not explicitly carry information indicating a deployment type, features indicated by the PSS or SS may be used to hypothesize the deployment type. For example, a stand-alone NB-IoT deployment may not need to puncture CRS tones, or add a cyclic prefix. These features may be detected by a UE attempting to decode a PBCH and used to hypothesize the deployment type.

According to some aspects of the present disclosure, a payload configuration may be based on the operating mode. For example, a stand-alone deployment may not need to signal the bandwidth available, or a position of the NB bandwidth within a wider system bandwidth. According to some aspects, subframe numbers may also vary based on the operating mode. For example, a different number of bits may be required to in the PBCH to indicate the number of PBCH repetitions.

According to some aspects of the present disclosure, scheduling parameters for SIB1 may be determined by information in the PBCH and the deployment mode. For example, the SIB scheduling parameters may be based on one or more MIB fields in conjunction with the deployment mode.

As discussed above, the PBCH repetition pattern may be based on the deployment type, and absent an indication of the deployment type, the UE may have to blind decode the PBCH in order to determine the PBCH repetition pattern. According to some aspects of the present disclosure, a UE may be configured to determine the deployment type for a NB-IoT based on the PBCH. For example, the PBCH may include an indication, such as a bit, that the NB-IoT deployment is an in-band or guard band deployment. Another example may also include a defined scrambling sequence, similar to that described above with regards to PSS and SSS.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or combinations thereof.

Those of skill would further appreciate that the various illustrative logical blocks, modules, circuits, and algorithm steps described in connection with the disclosure herein may be implemented as electronic hardware, software/firmware, or combinations thereof. To clearly illustrate this interchangeability of hardware and software/firmware, various illustrative components, blocks, modules, circuits, and steps have been described above generally in terms of their functionality. Whether such functionality is implemented as hardware or software/firmware depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software/firmware module executed by a processor, or in a combination thereof. A software/firmware module may reside in RAM memory, flash memory, ROM memory, EPROM memory, EEPROM memory, phase change memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software/firmware, or combinations thereof. If implemented in software/firmware, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, flash memory, phase change memory, CD/DVD or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software/firmware is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method for wireless communications by a user equipment (UE) in a wireless network, comprising:
   transmitting information in at least a narrowband region of a system bandwidth;
   receiving, a first number of symbols within a first subframe on a physical channel;
   determining a number of blind decodes to perform on the first number of symbols based on at least a complexity of the UE, wherein the determined number of blind decodes comprises:
     a first number of blind decodes when the complexity of the UE is a low complexity;
     a second number of blind decodes when the complexity of the UE is a medium complexity; and
     a third number of blind decodes when the complexity of the UE is high complexity, wherein:
       the first number of blind decodes is less than the second number of blind decodes and the third number of blind decodes; and
       the second number of blind decodes is less than the third number of blind decodes;
   performing the determined number of blind decodes on the first number of symbols to Obtain a first set of bits;
   performing one or more cyclic shifts on the first set of bits;
   calculating a redundancy check value for the cyclically-shifted first set of bits, wherein a redundancy check ordering is reversed and calculating the redundancy check value is performed from a least significant bit to most significant bit; and
   decoding an information block based on whether the redundancy check value passes.

2. The method of claim 1, wherein performing the determined number of blind decodes comprises de-scrambling, de-interleaving and de-rate matching the first number of symbols.

3. The method of claim 1, wherein the receiving comprises receiving within a narrowband region of wider system bandwidth.

4. The method of claim 1, wherein the first number of symbols are obtained from a tail-biting convolutional code (TBCC).

5. The method of claim 1, further comprising:
   receiving a second number of symbols within a second subframe on the physical channel;
   obtaining a second set of bits from the second number of symbols; and
   performing one or more cyclic shifts on the second set of bits.

6. The method of claim 5, wherein the second set of bits comprise a number of bits cyclically shifted based on the first set of bits, and combining the first number of symbols with the second number of symbols, wherein the combining comprises:
   calculating a first set of log likelihood ratios (LLRs) from the first number of symbols;
   calculating a second set of LLRs from the second number of symbols;
   calculating a third set of LLRs by applying a cyclic shift to the second set of LLRs; and
   combining the first set of LLRs and the third set of LLRs.

7. The method of claim 5, wherein the second number of symbols include a second payload different from a first payload of the first number of symbols; and
   combining the second number of symbols with the first number of symbols.

8. The method of claim 1, wherein the receiving comprising:
   receiving a signal having an indication of one or more deployment configurations; and
   selecting a transmission configuration from a set of predetermined transmission configurations, based on the indication of the deployment configuration.

9. The method of claim 8, wherein the predetermined transmission configuration comprises at least one of: a resource element mapping, a payload size, a payload interpretation, a number of repetitions, a scrambling sequence, and a time during which a payload may remain unchanged, or wherein the deployment configuration comprises one of: a one or more narrowband regions of a wider system bandwidth, or a standalone deployment.

10. The method of claim 8, wherein receiving the signal further comprises blindly decoding or detecting a signal for each of the deployment configurations.

11. The method of claim 1, wherein the higher the complexity of the UE, the greater the number of blind decodes.

12. The method of claim 1, wherein the determined number of blind decodes to perform comprises one of:
   one blind decode when the complexity of the UE is low;
   two blind decodes when the complexity of the UE is medium; and four blind decodes when the complexity of the UE is high.

13. The method of claim 1, wherein performing the one or more cyclic shifts on the first set of bits comprises
applying a null shift to an initial transmission at a beginning of a physical broadcast channel (PBCH) update cycle.

14. An apparatus for wireless communications by a user equipment (UE) in a wireless network, comprising:
at least one processor configured to:
transmit information in at least a narrowband region of a system bandwidth;
receive a first number of symbols within a first subframe on a physical channel;
determine a number of blind decodes to perform on the first number of symbols based on at least complexity of the apparatus, wherein the determined number of blind decodes comorises:
a first number of blind decodes when Ike complexity of the UE is a low complexity;
a second number of blind decodes when the complexity of the UE is a medium complexity; and
a third number of blind decodes when the complexity of the UE is high complexity, wherein:
the first number of blind decodes is less than the second number of blind decodes and the third number of blind decodes; and
the second number of blind decodes is less than the third number of blind decodes:
perform the determined number of blind decodes on the first number of symbols to obtain a first set of bits;
perform one or more cyclic shifts on the first set of bits;
calculate a redundancy check value for the cyclically-shifted first set of bits, wherein a redundancy check ordering is reversed and calculating the redundancy check value is performed from a least significant bit to most significant bit; and
decode an information block based on whether the redundancy check value passes; and
a memory coupled to the at least one processor.

15. The apparatus of claim 14, wherein the receiving comprises:
receiving a signal having an indication of a deployment configuration; and
selecting a transmission configuration from a set of predetermined transmission configurations, based on the indication of the deployment configuration.

16. An apparatus for wireless communications by a uses equipment (UE) in a wireless network, comprising:
means for transmitting information in at least a narrowband region of a system bandwidth:
means for receiving, a first number of symbols within a first subframe on a physical channel;
means for determining a number of blind decodes to perform on the first number of symbols based on a complexity of the UE, wherein the determined number of blind decodes comprises:
a first number of blind decodes when the complexity of the UE is a low complexity;
a second number of blind decodes when the complexity of the UE is a medium complexity; and
a third number of blind decoder when the complexity of the UE is high complexity, wherein:
the first number of blind decodes is less than the second number of blind decodes and the third number of blind decodes; and
the second number of blind decodes is less than the third number of blind decodes:
means for performing the determined number of blind decodes on the first number of symbols to obtain a first set of bits;
means for performing one or more cyclic shifts on the first set of bits;
means for calculating a redundancy Check value for the cyclically-shifted first set of bits,
wherein a redundancy check ordering is reversed and calculating the redundancy check value is performed from a least significant bit to most significant bit; and
means for decoding an information block based on whether the redundancy check value passes.

17. A non-transitory computer-readable medium for wireless communications by a user equipment (UE) in a wireless network, comprising:
instructions that, when executed by at least one processor, cause the at least one processor to:
transmit information in at least a narrowband region of a system bandwidth;
receive a first number of symbols within a first subframe on a physical channel;
determine a number of blind decodes to perform on the first number of symbols based on a complexity of the UE, wherein the determined number of blind decodes comprises:
a first number of blind decodes when the complexity of the UE is a low complexity;
a second number of blind decodes when the complexity of the UE is a medium complexity; and
a third number of blind decodes when the complexity of the UE is high complexity, wherein:
the first number of blind decodes is less than the second number of blind decodes and the third number of blind decodes; and
the second number of blind decodes is less than the third number of blind decodes:
perform the determined number of blind decodes on the first number of symbols to obtain a first set of bits;
perform one or more cyclic shifts on the first set of bits;
calculate a redundancy check value for the cyclically-shifted first set of bits, wherein a redundancy check ordering is reversed and calculating the redundancy check value is performed from a least significant bit to most significant bit; and
decode an information block based on whether the redundancy check value passes.

* * * * *